(12) United States Patent
Hwang

(10) Patent No.: US 9,997,556 B2
(45) Date of Patent: Jun. 12, 2018

(54) IMAGE SENSOR

(71) Applicant: SK hynix Inc., Gyeonggi-do (KR)

(72) Inventor: Sun-Ha Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days. days.

(21) Appl. No.: 15/482,208

(22) Filed: Apr. 7, 2017

(65) Prior Publication Data

US 2018/0102392 A1 Apr. 12, 2018

(30) Foreign Application Priority Data

Oct. 6, 2016 (KR) .................. 10-2016-0128837

(51) Int. Cl.
  H01L 27/144 (2006.01)
  H01L 27/146 (2006.01)
  H04N 5/378 (2011.01)

(52) U.S. Cl.
  CPC .... *H01L 27/14643* (2013.01); *H01L 27/1461* (2013.01); *H01L 27/14605* (2013.01); *H01L 27/14614* (2013.01); *H01L 27/14689* (2013.01); *H04N 5/378* (2013.01)

(58) Field of Classification Search
  CPC .............................. H01L 27/14643
  See application file for complete search history.

(56) References Cited

U.S. PATENT DOCUMENTS

| 5,841,159 | A | * | 11/1998 | Lee | .................. | H01L 27/14609 257/291 |
| 6,040,593 | A | * | 3/2000 | Park | .................. | H01L 27/14609 257/233 |
| 6,184,055 | B1 | * | 2/2001 | Yang | .................. | H01L 27/1443 257/233 |
| 8,748,945 | B2 | | 6/2014 | Shin | | |
| 9,054,003 | B2 | | 6/2015 | Ahn et al. | | |
| 2017/0018591 | A1 | * | 1/2017 | Yamaguchi | ....... | H01L 27/14638 |
| 2017/0194372 | A1 | * | 7/2017 | Ha | .................... | H01L 27/14614 |
| 2017/0330907 | A1 | * | 11/2017 | Kwag | ............... | H01L 27/14636 |

* cited by examiner

*Primary Examiner* — Thao P Le
(74) *Attorney, Agent, or Firm* — IP & T Group LLP

(57) ABSTRACT

An image sensor includes: a pixel array including a plurality of unit pixels that are arrayed in two dimensions, wherein each of the plurality of the unit pixels includes: a substrate that including a photoelectric conversion element; a recess pattern formed in the substrate to overlap with the photoelectric conversion element and correspond to a center of the photoelectric conversion element; a first gate suitable for filling at least the recess pattern; a second gate formed over the substrate to overlap with the photoelectric conversion element and to be adjacent to the first gate in a first diagonal direction; and a third gate formed over the substrate to overlap with the photoelectric conversion element and to be adjacent to the first gate in a second diagonal direction which intersects with the first diagonal direction.

19 Claims, 15 Drawing Sheets

IMAGE SENSOR

CROSS-REFERENCE TO RELATED APPLICATIONS

The present application claims priority of Korean Patent Application No. 10-2016-0128837, filed on Oct. 6, 2016, which is incorporated herein by reference in its entirety.

BACKGROUND

1. Field

Exemplary embodiments of the present invention relate to a semiconductor device fabrication technology, and more particularly, to an image sensor including pixel transistors with improved carrier mobility.

2. Description of the Related Art

An image sensor converts an optical image into an electrical signal. Recently, due to developments in the computer and communication industries, a demand for an image sensor with improved performance has increased for various devices, such as digital cameras, camcorders Personal Communication Systems (PCS), game machines, security cameras, medical micro-cameras, and robots.

SUMMARY

Embodiments of the present invention are directed to an image sensor with improved performance.

In accordance with an embodiment of the present invention, an image sensor includes: a pixel array including a plurality of unit pixels that are arrayed in two dimensions, wherein each of the plurality of the unit pixels includes: a substrate including a photoelectric conversion element; a recess pattern formed in the substrate to overlap with the photoelectric conversion element and correspond to a center of the photoelectric conversion element; a first gate suitable for filling at least the recess pattern; a second gate formed over the substrate to overlap with the photoelectric conversion element and to be adjacent to the first gate in a first diagonal direction; and a third gate formed over the substrate to overlap with the photoelectric conversion element and to be adjacent to the first gate in a second diagonal direction which intersects with the first diagonal direction.

Each of the plurality of the unit pixels may further include: a floating diffusion that is formed to confront the third gate based on the first gate in the second diagonal direction; and a first active region that overlaps with the photoelectric conversion element and has a first end where the recess pattern is disposed and a second end where the floating diffusion is disposed.

The first gate may include: a first region for filling the recess pattern; and a second region that is formed over the first active region to cover the first region and has an end overlapping with a portion of the floating diffusion.

The substrate may have a monocrystalline state, and a crystallographic direction of the substrate corresponding to a channel length direction of a channel provided by the first region of the first gate may be the same as a crystallographic direction of the substrate corresponding to a channel length direction of a channel provided by the second region of the first gate.

A crystal face of a surface of the substrate may be a (100) plane among a plurality of planes determined by Miller Indices, and a crystallographic direction of the substrate corresponding to a channel length direction of a channel provided by the first region of the first gate and a channel length direction of a channel provided by the second region of the first gate may be a <100> direction among a plurality of planes determined by Miller Indices.

Each of the plurality of the unit pixels may further include: a second active region that is disposed adjacent to the first active region while overlapping with the photoelectric conversion element, and the second active region may include: a first region that has a bar shape extended in the first diagonal direction; a second region that has a bar shape extended in the second diagonal direction; and a third region that couples the first region and the second region to each other.

The third gate may be disposed over the first region of the second active region, and the second gate may be disposed over the second region of the second active region.

A crystal face of a surface of the substrate may be a (100) plane among a plurality of planes determined by Miller Indices, and a crystallographic direction of the substrate corresponding to a channel length direction of a channel provided by the first gate, a channel length direction of a channel provided by the second gate, and a channel length direction of a channel provided by the third gate may be a <100> direction among a plurality of planes determined by Miller Indices.

Each of the plurality of the unit pixels may further include a well that is formed in the substrate to overlap with the photoelectric conversion element; and a pick-up region that is formed to overlap with the photoelectric conversion element and confront the second gate based on the first gate in the first diagonal direction.

The pixel array may include a plurality of sub-arrays each of which include a read-out circuit, and each of the plurality of the sub-arrays may include a plurality of unit pixels that are arrayed in an N×M matrix form (where each of N and M is a natural number), and the plurality of the unit pixels may have a planar shape that is symmetrical in a row direction and/or column direction in each of the plurality of the sub-arrays.

The read-out circuit may include a transfer transistor including a transfer gate, a reset transistor including a reset gate, a drive transistor including a drive gate, and a selection transistor including a selection gate, and when each of the plurality of the sub-arrays includes a first unit pixel and a second unit pixel that are arrayed in a 1×2 matrix structure, a first gate of the first unit pixel and a first gate of the second unit pixel may correspond to the transfer gate, and a second gate of the first unit pixel, a third gate of the first unit pixel, and a second gate of the second unit pixel may correspond to the selection gate, the drive gate, and the reset gate, respectively, and a third gate of the second unit pixel may be a dummy gate.

The read-out circuit may include a transfer transistor including a transfer gate, a reset transistor including a reset gate, a drive transistor including a drive gate, and a selection transistor including a selection gate, and when each of the plurality of the sub-arrays includes a first unit pixel, a second unit pixel, a third unit pixel, and a fourth unit pixel that are arrayed in a 2×2 matrix structure, first gates of the first unit pixel to the fourth unit pixel may correspond to the transfer gate, and a second gate of the first unit pixel, a third gate of the first unit pixel, and a second gate of the second unit pixel may correspond to the selection gate, the drive gate, and the reset gate, respectively, and a third gate of the second unit pixel, first to third gates of the third unit pixel, and first to third gates of the fourth unit pixel may be dummy gates.

In accordance with another embodiment of the present invention, an image sensor includes: a pixel array including a plurality of unit pixels that are arrayed in two dimensions, wherein each of the plurality of the unit pixels includes: a substrate including a photoelectric conversion element; a recess pattern formed in the substrate to overlap with the photoelectric conversion element and correspond to a center of the photoelectric conversion element; a first gate suitable for filling at least the recess pattern; a second gate formed over the substrate to overlap with the photoelectric conversion element and formed on a first side of the first gate to be adjacent to the first gate in a first diagonal direction that intersects with a second diagonal direction; a third gate formed over the substrate to overlap with the photoelectric conversion element and to be adjacent to the first gate in the second diagonal direction; and a fourth gate formed over the substrate to overlap with the photoelectric conversion element and formed on a second side of the first gate to be adjacent to the first gate in the first diagonal direction.

Each of the plurality of the unit pixels may further include: a floating diffusion that is formed to confront the third gate based on the first gate in the second diagonal direction; and a first active region that overlaps with the photoelectric conversion element and has a first end where the recess pattern is disposed and a second end where the floating diffusion is disposed.

The first gate may include: a first region for filling the recess pattern; and a second region that is formed over the first active region to cover the first region and has an end overlapping with a portion of the floating diffusion.

Each of the plurality of the unit pixels may further include: a second active region that overlaps with the photoelectric conversion element and is disposed adjacent to the first active region, and the second active region may include: a first region that has a bar shape extended in the first diagonal direction; a second region that has a bar shape extended in the second diagonal direction and is disposed on the first side of the first gate in the first diagonal direction; a third region suitable for coupling the first region and the second region to each other; a fourth region that has a bar shape extended in the second diagonal direction and is disposed on the second side of the first gate in the first diagonal direction; and a fifth region suitable for coupling the first region and the fourth region to each other.

The third gate may be disposed on a first region of the second active region, and the second gate may be disposed on a second region of the second active region, and the fourth gate may be disposed on a fourth region of the second active region.

The substrate has a monocrystalline state, a crystal face of a surface of the substrate may be a (100) plane among a plurality of planes determined by Miller Indices, and a crystallographic direction of the substrate corresponding to a channel length direction of a channel provided by the first gate, a channel length direction of a channel provided by the second gate, a channel length direction of a channel provided by the third gate, and a channel length direction of a channel provided by the fourth gate may be a <100> direction among a plurality of planes determined by Miller Indices.

The pixel array may include a plurality of sub-arrays, and each of the plurality of the sub-arrays may include a plurality of unit pixels that are arrayed in an N×M matrix form (where each of N and M is a natural number), and the plurality of the unit pixels may have a planar shape that is symmetrical in a row direction and/or column direction in each of the plurality of the sub-arrays.

In accordance with yet another embodiment of the present invention, an image sensor includes: a photoelectric conversion element suitable for generating photocharges in response to incident light; a transfer transistor suitable for transferring the photocharges to a floating diffusion in response to a transfer signal; a reset transistor suitable for initializing the floating diffusion in response to a reset signal; a drive transistor suitable for generating an image signal corresponding to the photocharges stored in the floating diffusion, as a gate of the drive transistor is coupled to the floating diffusion; and a selection transistor suitable for outputting the image signal in response to a selection signal, wherein the transfer transistor, the reset transistor, the drive transistor, and the selection transistor are formed in a substrate having a monocrystalline state, and a crystal face of a surface of the substrate is a (100) plane among a plurality of planes determined by Miller Indices, and a crystallographic direction of the substrate corresponding to channel length directions of a channel of the transfer transistor, a channel of the reset transistor, a channel of the drive transistor, and a channel of the selection transistor is a <100> direction among a plurality of planes determined by Miller Indices.

BRIEF DESCRIPTION OF THE DRAWINGS

The above and other features and advantages of the present invention will become more apparent to those skilled in the art to which the present invention pertains by the following detailed description with reference to the attached drawings in which:

FIGS. 5A and 5B are cross-sectional views of the unit pixel of the image sensor in accordance with the first embodiment of the present invention that are taken along a line A-A' and a line B-B' shown in. FIGS. 3 and 4, respectively.

DETAILED DESCRIPTION

Figure 1:
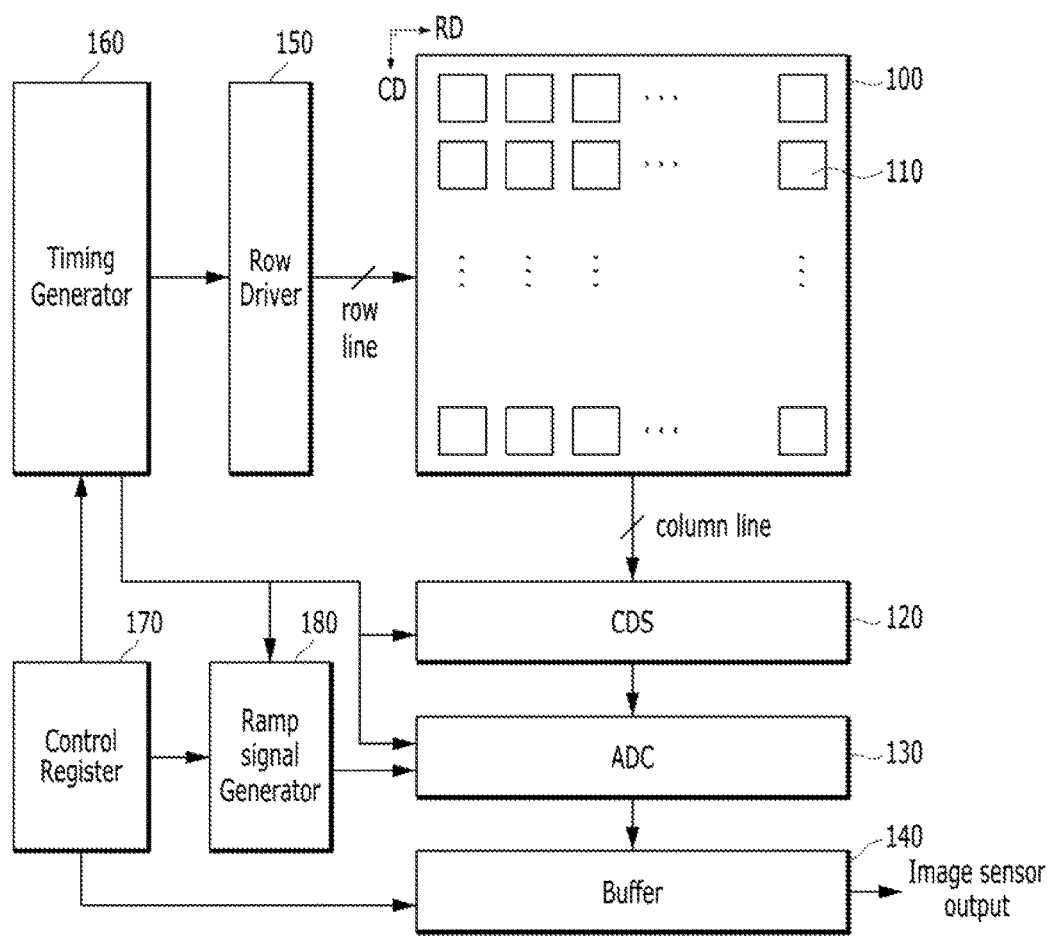
FIG. 1 is a block diagram illustrating an image sensor in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a drawing or a detailed description describes a multi-layer structure having two or more layers, the relative positional relationship or arrangement order of the illustrated layers just reflects a particular embodiment and does not limit the concept and spirit of the present invention. Also, the drawing or the detailed description of the multi-layer structure may not reflect all the layers existing in a particular multi-layer structure (for example, there may be one or more additional layers between the two illustrated layers). For example, when a first layer is referred to as being "on" a second layer or "on" a substrate, it not only refers to a case where the first layer is formed directly on the second layer or the substrate but also a case where a third layer exists between the first layer and the second layer or between the first layer and the substrate.

The following embodiment of the present invention provides an image sensor with improved performance. Herein, the image sensor with improved performance may be an image sensor capable of providing a high-pixel image. To provide a high-pixel image, an image sensor including as many unit pixels as possible integrated within a limited area is needed. Therefore, image sensors in accordance with the embodiments of the present invention may have a stacked structure where a photoelectric conversion element and pixel transistors are vertically stacked in each unit pixel. In other words, since the photoelectric conversion element and the pixel transistors overlap with each other in each unit pixel, the image sensor may have a fill factor substantially equal to 100%.

The following embodiments of the present invention provide an image sensor including pixel transistors capable of performing a high-speed operation by improving carrier mobility in a channel region. The pixel transistors may form a read-out circuit for generating pixel signals, e.g., image signals and image reset signals, by using photocharges which are generated in the photoelectric conversion element from incident light. The read-out circuit may be formed of at least three or more pixel transistors. For example, the read-out circuit may include a transfer transistor TX, a reset transistor RX, a drive transistor DX, and a selection transistor SX.

FIG. 1 is a block diagram illustrating an image sensor in accordance with an embodiment of the present invention. Referring to FIG. 1, the image sensor may include a pixel array 100, a correlated double sampling (CDS) unit 120, an analog-to-digital converter (ADC) 130, a buffer 140, a row driver 150, a timing generator 160, a control register 170, and a ramp signal generator 180. The pixel array 100 may include a plurality of unit pixels 110 arranged in a matrix.

The timing generator 160 may generate one or more control signals for controlling the row driver 150, the CDS unit 120, the ADC 130, and the ramp signal generator 180. The control register 170 may generate one or more control signals for controlling the ramp signal generator 180, the timing generator 160, and the buffer 140.

The row driver 150 may drive the pixel array 100 row by row. For example, the row driver 150 may generate a select signal for selecting any one row line of a plurality of row lines. Each of the unit pixels 110 may sense incident light and output an image reset signal and an image signal to the CDS unit 120 through a column line. The CDS unit 120 may perform a correlated double sampling in response to the image reset signal and the image signal.

The ADC 130 may compare a ramp signal received from the ramp signal generator 180 with a sampling signal received from the CDS unit 120 as an analog signal, and output a comparison signal as a digital signal. According to a clock signal provided from the timing generator 160, the ADC 130 may count the level transition time of the comparison signal, and output the count value to the buffer 140. The ramp signal generator 180 may operate under control of the timing generator 160.

The buffer 140 may store a plurality of digital signals received from the ADC 130 and then sense and amplify the digital signals. Thus, the buffer 140 may include a memory (not illustrated) and a sense amplifier (not illustrated). The memory may store count values received from the ADC 130. The count values may represent signals outputted from the plurality of unit pixels 110. The sense amplifier may sense and amplify the count values outputted from the memory.

To provide a high-pixel image, the number of unit pixels 110 integrated in the pixel array 100 needs to be increased. That is, a larger number of unit pixels 110 needs to be arranged in a limited area. For this structure, the physical size of each unit pixel 110 needs to be reduced. However, the image sensor is operated based on a pixel signal generated from each of the unit pixels 110 in response to incident light. Thus, when the physical size of the unit pixel 110 is reduced, the characteristics of the unit pixel 110 are degraded.

The following embodiments are directed to an image sensor which is capable not only of maximizing the fill factor of the photoelectric conversion element but also of securing the area and characteristics for the pixel transistors, despite reducing the physical size.

Hereafter, an image sensor in accordance with a first embodiment of the present invention is described with reference to FIGS. 2 to 5A and 5B. Herein, the image sensor in accordance with the first embodiment of the present invention is described by taking an example where one photoelectric conversion element PD is coupled to one read-out circuit and the read-out circuit is formed of three transistors.

Figure 2:
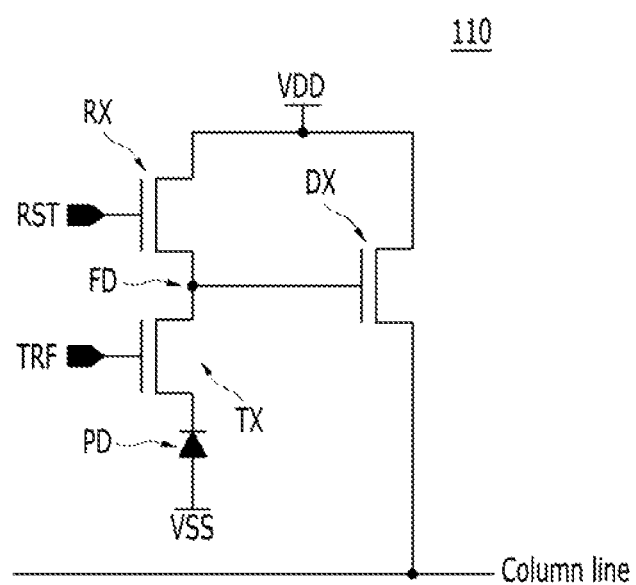
FIG. 2 is a diagram illustrating an equivalent circuit of a unit pixel of an image sensor in accordance with a first embodiment of the present invention.
Figure 3:
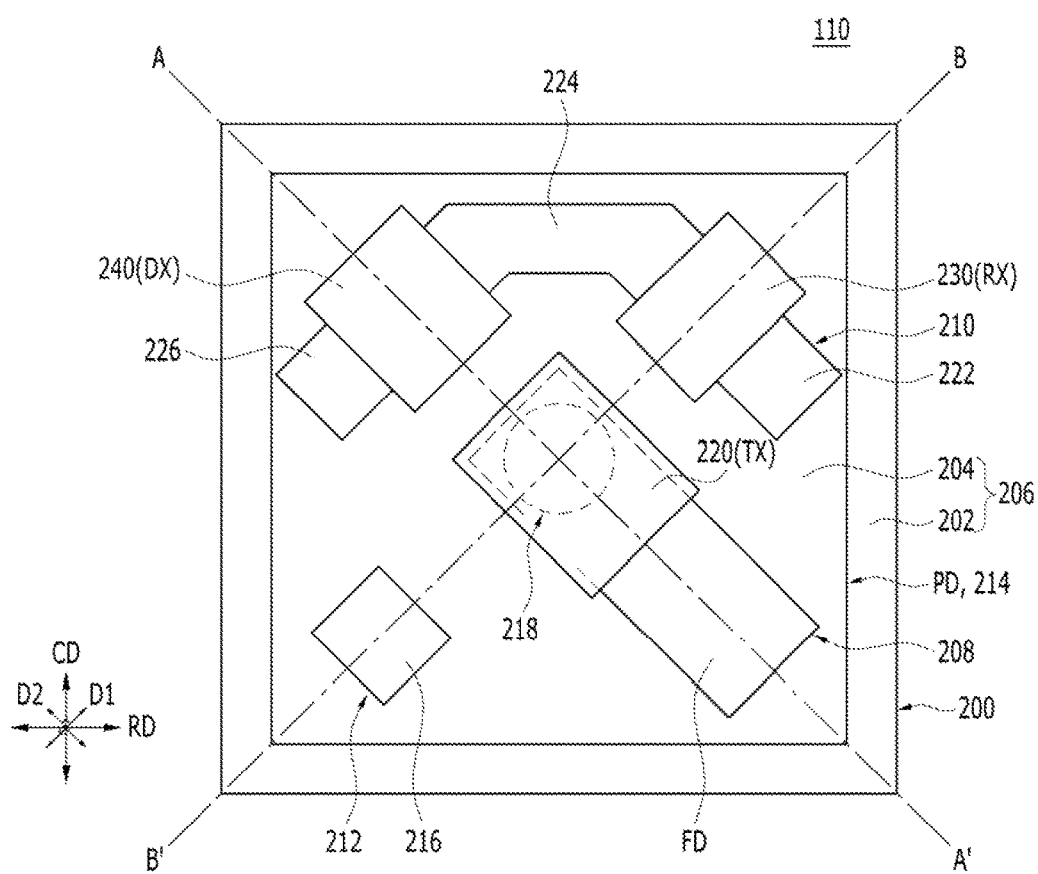
FIG. 3 is a plan view of the unit pixel of the image sensor in accordance with the first embodiment of the present invention.
Figure 4:
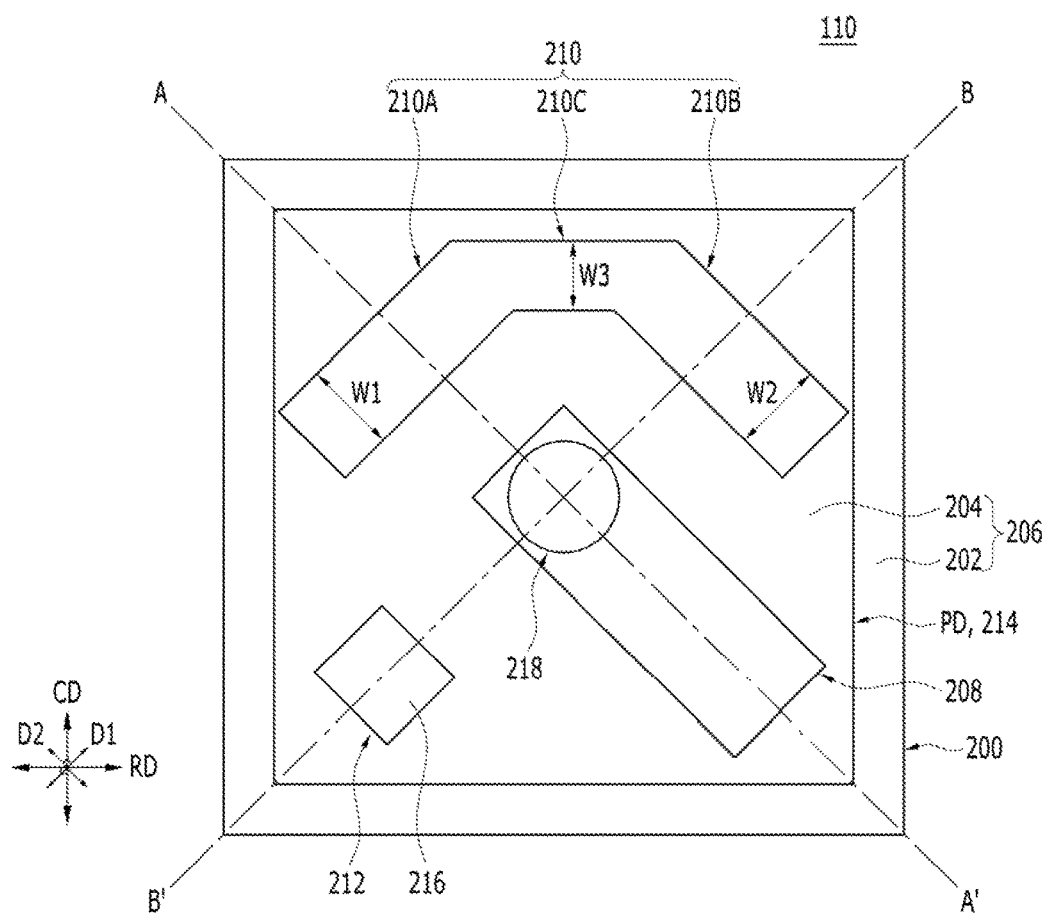
FIG. 4 is a plan view of a recess pattern and active regions in the unit pixel of the image sensor in accordance with the first embodiment of the present invention.
Figure 5A:
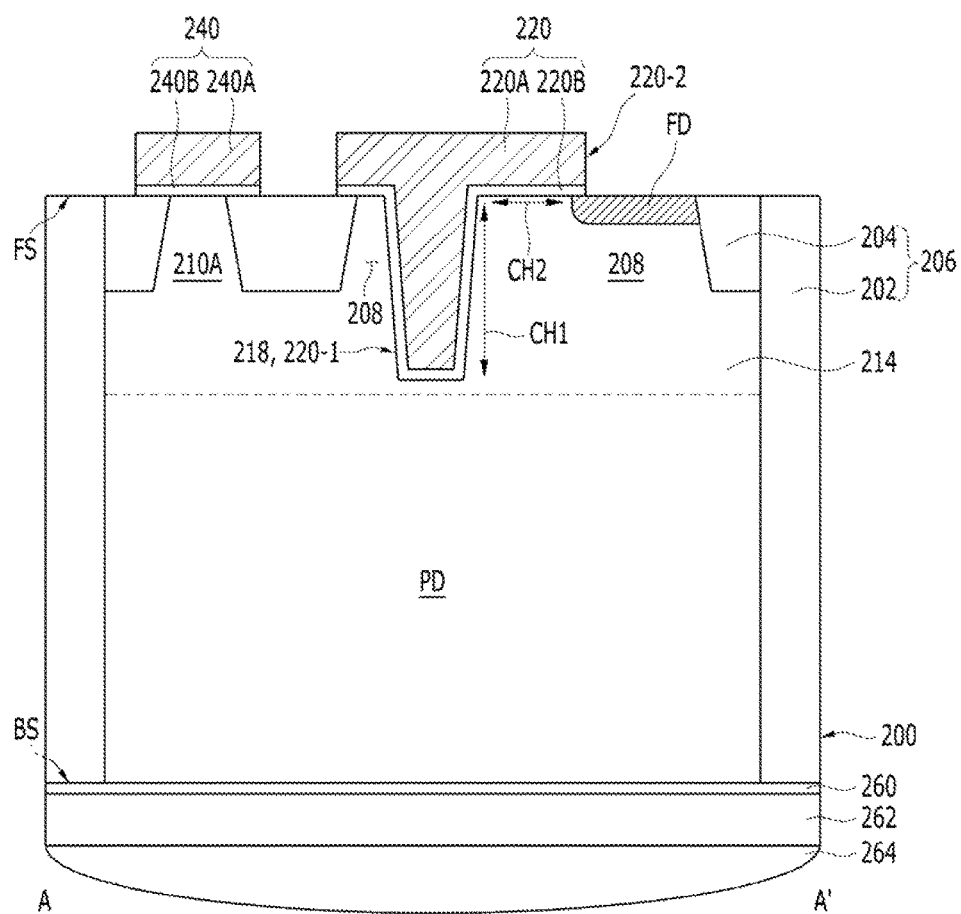
Figure 5B:
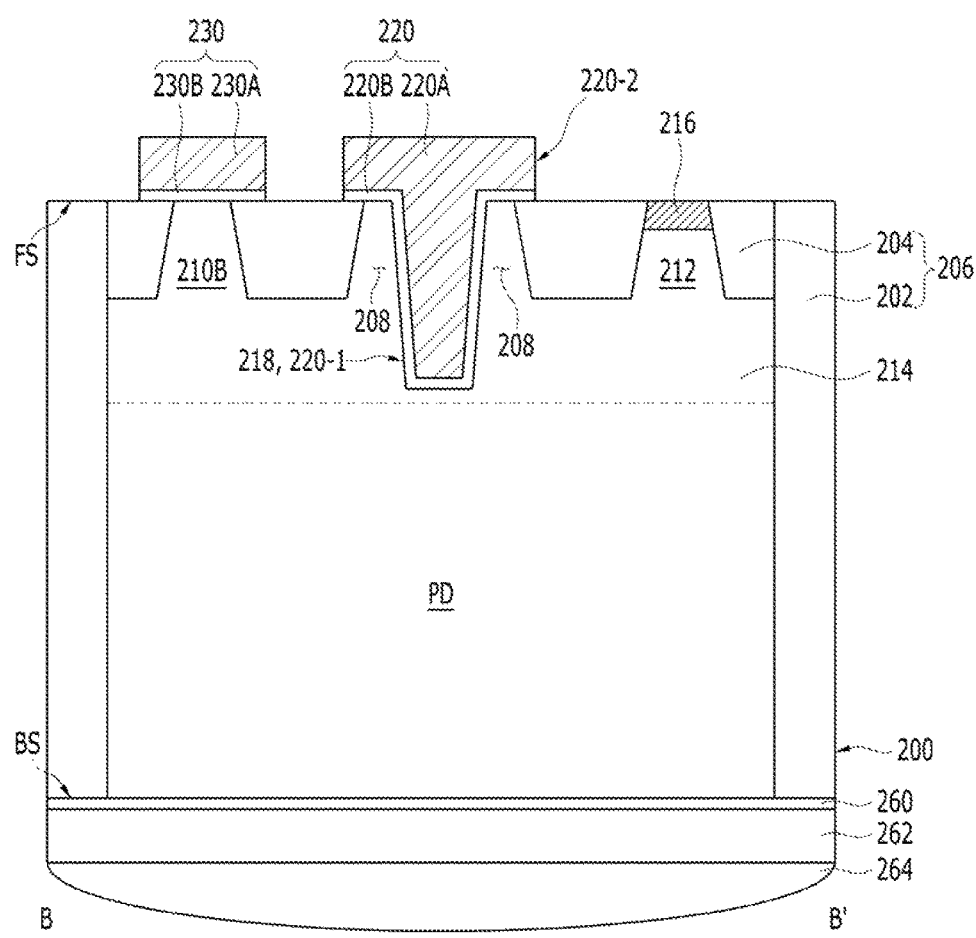

FIG. 2 is a diagram illustrating an equivalent circuit of a unit pixel 110 of an image sensor in accordance with a first embodiment of the present invention. FIG. 3 is a plan view of the unit pixel 110 of the image sensor in accordance with the first embodiment of the present invention. FIG. 4 is a plan view of a recess pattern and active regions in the unit pixel 110 of the image sensor in accordance with the first embodiment of the present invention. FIGS. 5A and 5B are cross-sectional views of the unit pixel 110 of the image sensor in accordance with the first embodiment of the present invention that are taken along a line A-A' and a line B-B' shown in FIGS. 3 and 4, respectively.

First of all, as illustrated in FIG. 2, the unit pixel 110 may include one read-out circuit and one photoelectric conversion element PD coupled to the read-out circuit. Herein, the read-out circuit may include a transfer transistor TX, a reset transistor RX, and a drive transistor DX.

The photoelectric conversion element PD may be a photodiode. The photoelectric conversion element PD may be coupled between a transfer transistor TX and a second node VSS that is set up with a ground voltage. The reset transistor RX may be coupled between the transfer transistor TX and the first node VDD which is set up with a power source voltage. Also, a floating diffusion FD may be coupled between the reset transistor RX and the transfer transistor TX. The transfer transistor TX may operate in response to a transfer signal TRF applied to the gate of the transfer transistor. The reset transistor RX may operate in response to a reset signal RST applied to the gate of the gate transistor. The gate of the drive transistor DX may be coupled to the floating diffusion FD. One side (e.g., a drain) of the drive transistor DX may be coupled to the first node VDD, and another side (e.g., a source) of the drive transistor DX may be coupled to a column line. The drive transistor DX may generate and output an image signal or an image reset signal through the column line in response to the amount of the photocharges stored in the floating diffusion FD. Herein, the image signal or an image reset signal may refer to an output voltage that is generated by processing a power source voltage to correspond to the amount of the photocharges stored in the floating diffusion D.

Herein, the transfer transistor TX, the reset transistor RX and the drive transistor DX may be formed over a substrate 200 having a monocrystalline state as shown in FIG. 3. A channel of the transfer transistor TX, a channel of the reset transistor RX, and a channel of the drive transistor DX may have the same crystallographic direction of the substrate corresponding to the channel length direction. The surface of the substrate having a monocrystalline state may have a predetermined crystal face and crystallographic direction based on Miller Indices. For example, when the crystal face of the surface of the substrate is a (100) plane among a plurality of planes determined by Miller Indices, the channel of the transfer transistor TX, the channel of the reset transistor RX, and the channel of the drive transistor DX may have a crystallographic direction of the substrate corresponding to the channel length direction of a <100> direction among a plurality of directions determined by Miller Indices.

Subsequently, as illustrated in FIGS. 3, 4, and 5A and 5B, the unit pixel 110 may include a substrate 200, a recess pattern 218, a first gate 220, a second gate 230, a third gate 240, and a pick-up region 212. The substrate 200 may include a photoelectric conversion element PD which is isolated by an isolation structure 206. The recess pattern 218 may be formed in the substrate 200 to overlap with the photoelectric conversion element PD and correspond to the center of the photoelectric conversion element PD. The first gate 220 may fill the recess pattern 218 at least (FIGS. 5A and 5B). The second gate 230 may be formed over the substrate 200 to overlap with the photoelectric conversion element PD and to be adjacent to the first gate 220 in a first direction D1 (FIG. 3). The third gate 240 may be formed over the substrate 200 to overlap with the photoelectric conversion element PD and to be adjacent to the first gate 220 in a second direction D2. The pick-up region 212 may be formed over the substrate 200 to overlap with the photoelectric conversion element PD and to be adjacent to the first gate 220 in the first direction D1. Herein, the first direction D1 and the second direction D2 may refer to a diagonal direction have a predetermined gradient based on a row direction RD or a column direction CD. The predetermined gradient may be approximately ±45°. The first direction D1 may be a direction intersecting with the second direction D2. The first direction D1 and the second direction D2 may be orthogonal to each other.

Hereafter, the constituent elements are described in detail by referring to the accompanying drawings.

The unit pixel 110 may include the substrate 200 provided with a first active region 208, a second active region 210, and a pick-up region 212 that are defined by an isolation structure 206 (FIGS. 3, 5A and 5B). Also, the unit pixel 110 may include a photoelectric conversion element PD and a well 214 that are formed in the substrate 200. The photoelectric conversion element PD and the well 214 may overlap with each other and one of the sides of each of the photoelectric conversion element PD and the well 214 may contact each other so as to form a stacked structure in the up and down direction (FIGS. 5A and 5B).

The substrate 200 may be or include a semiconductor substrate of a monocrystalline state. The substrate 200 may be or include a silicon-containing material. In an embodiment, the semiconductor substrate may include a monocrystalline silicon-containing material. For example, the substrate 200 may be a monocrystalline bulk silicon substrate or a silicon epitaxial layer which is grown over a monocrystalline bulk silicon substrate.

In some embodiments, the surface of the substrate 200 having a monocrystalline state, which includes a front side FS and a back side BS, may have a predetermined crystal face and crystallographic direction that may be described based on Miller Indices (FIGS. 5A and 5B). For example, the crystal face of the front and back surfaces FS and BS of the substrate 200 may be a (100) plane. Therefore, the vertical direction, which is a direction from the front side FS of the substrate 200 to the back side BS or a direction from the back side BS of the substrate 200 to the front side FS, may be a <100> direction. Also, the horizontal direction, which is the crystallographic direction corresponding to a row direction RD and a column direction CD which intersect with each other in the substrate 200, may be a <110> direction, and the crystallographic direction corresponding to the first direction D1 and the second direction D2 which intersect with each other in a diagonal direction may be the <100> direction. Herein, in the monocrystalline silicon substrate 200 having the (100) plane, the <100> direction is known having a higher carrier mobility than other crystallographic directions including the <110> direction. In particular, in terms of the migration of electrons, the <100> direction is known having a higher mobility than other crystallographic directions including the <110> direction.

The isolation structure 206 may include a Shallow Trench Isolation (STI), a Deep Trench Isolation (DTI), or a potential barrier. The potential barrier may include an impurity region that is formed by implanting an impurity into the substrate 200. For example, the potential barrier may be a impurity region that is formed by implanting a P-type impurity, such as boron (B), into the substrate 200. The isolation structure 206 may include a first isolation structure 202 that isolates neighboring unit pixels 110 from each other and a second isolation structure 204 that defines the first active region 208, the second active region 210, and the pick-up region 212 (FIGS. 5A and 5B). The first isolation structure 202 may include the DTI or the potential barrier, and the second isolation structure 204 may include the STI. The first isolation structure 202 may be formed to be extended from the front side FS or the back side BS of the substrate 200 and penetrate through the substrate 200. The second isolation structure 204 may be formed in the well 214 to overlap with the photoelectric conversion element PD.

The photoelectric conversion element PD may include an organic or inorganic photodiode. For example, the photoelectric conversion element PD may have a stacked structure where a plurality of impurity regions formed in the substrate 200 and having complementary conductive types, e.g., P-type impurity regions and N-type impurity regions, are stacked in a vertical direction. The photoelectric conversion element PD may be formed to contact the back side BS of the substrate 200 (FIGS. 5A and 5B). The first isolation structure 202 may isolate neighboring photoelectric conversion elements PD.

The well 214 may provide a base for the pixel transistors to operate (FIGS. 5A and 5B). The well 214 may overlap with the photoelectric conversion element PD and the well 214 may be isolated from neighboring wells by the first isolation structure 202. The upper surface of the well 214 may contact the front side FS of the substrate 200, and the lower surface of the well 214 may contact the photoelectric conversion element PD. The well 214 may be formed by implanting impurity ions into the substrate 200. For example, the well 214 may be a P-type well 214 that is formed by implanting a P-type impurity into the substrate 200. All of the first active region 208, the second active region 210, and the pick-up region 212 may be formed in the well 214 (FIG. 3).

The first active region 208 may provide a space where at least a floating diffusion FD and a first transistor including the first gate 220 filling the recess pattern 218 are to be formed (FIGS. 3, 5A and 5B). The first active region 208 may have a bar shape that is extended in the second direction D2 and overlap with the photoelectric conversion element PD. The end of one side of the first active region 208 may overlap with the center of the photoelectric conversion element PD.

The second active region 210 may provide a space where a second transistor including the second gate 230 and a third transistor including the third gate 240 are to be formed (FIG. 3). The second active region 210 may include a first region 210A having a bar shape extended in the first direction D1, a second region 210B having a bar shape extended in the second direction D2, and a third region 210C having a bar shape extended in the row direction RD and coupling the first region 210A and the second region 210B (FIG. 4). Each of the first region 210A and the second region 210B may be disposed at one corner among the corners (or edges) of the unit pixel 110 over the same line. For instance, the first region 210A may be disposed at an upper left corner of the unit pixel 110, and the second region 210B may be disposed at an upper right corner of the unit pixel 110. The line width of the first region 210A, the second region 210B, and the third region 210C may be all the same (i.e. W1=W2-W3), or the line width W1 of the first region 210A may be wider than the line widths W2 and W3 of the second region 21013 and the third region 210C (i.e., W1>W2, W3). The latter case may provide a greater channel area of the third gate 240 formed over the first region 210A than the channel area of the second gate 230 formed over the second region 210B.

When the third gate 240 functions as a driver gate, the third gate 240 may provide a driver gate having a relatively greater channel area, thus improving noise characteristics of the read-out circuit. The geometrical shape of the second active region 210 may be formed to have a <100> direction as a crystallographic direction of the substrate 200 corresponding to the channel length direction of the channel of the second transistor and the channel length direction of the channel of the third transistor so as to improve the carrier mobility in the channel and provide a space where the pixel transistors are to be formed in the limited area.

The pick-up region 212 is a constituent element for applying a predetermined bias to the well 214 formed in the substrate 200 (FIGS. 3 and 4). The pick-up region 212 may have a planar shape of a square. The pick-up region 212 may include a fourth impurity region 216 that is formed in the substrate 200. The fourth impurity region 216 may have the same conductive type as that of the well 214, and the fourth impurity region 216 may have a higher impurity doping concentration than the well 214. For example, the fourth impurity region 216 may include a P-type impurity region. Although not illustrated, the fourth impurity region 216 of the pick-up region 212 may be coupled to the second node VSS which is set up with the ground voltage.

Also, the unit pixel 110 may include the recess pattern 218 that is formed in the first active region 208 to overlap with the photoelectric conversion element PD and formed in the substrate 200 to correspond to the center of the photoelectric conversion element PD, the first transistor that includes the first gate 220 filling at least the recess pattern 218, and the floating diffusion FD that is formed in the first active region 208.

The recess pattern 218 may provide a channel for transferring the photocharges generated in the photoelectric conversion element PD in response to the incident light to the floating diffusion FD. The recess pattern 218 is required because the well 214 and the photoelectric conversion element PD for the pixel transistors are vertically stacked to improve the fill factor (FIGS. 5A and 5B). As the recess pattern 218 is disposed close to the center of the photoelectric conversion element PD, the transfer efficiency may be improved. Also, as the recess pattern 218 is disposed close to the center of the photoelectric conversion element PD, the distance to the isolation structure 206, particularly, the first isolation structure 202, is increased, thereby improving the dark current characteristics originating from the first isolation structure 202. The bottom surface of the recess pattern 218 may be close to the interface between the well 214 and the photoelectric conversion element PD. As a modified example, although not illustrated in the drawing, the recess pattern 218 may have a shape that the lower region of the recess pattern 218 is buried in the photoelectric conversion element PD. In other words, the bottom surface of the recess pattern 218 may be disposed at a lower level than the level of the interface between the well 214 and the photoelectric conversion element PD. Meanwhile, although not illustrated in the drawing, an impurity region for controlling a threshold voltage and the carrier mobility in the channel may be formed in the substrate 200 contacting the surface (which includes the sides and bottom surface) of the recess pattern 218.

The first gate 220 may be a transfer gate. Therefore, the first transistor may be a transfer transistor TX (FIG. 3). The photoelectric conversion element PD and the floating diffusion FD may function as a source and a drain of the first transistor, respectively. The first gate 220 may fill the recess pattern 218 and have a portion protruded toward the substrate 200, and the protruded end of the first gate 220 that is protruded over the substrate 200 may overlap with a portion of the floating diffusion FD (FIGS. 5A and 5B). To be specific, the first gate 220 may include a first area 220-1 filling the recess pattern 218, and a second area 220-2 that is formed over the first active region 208 to cover the first area 220-1, has a bar shape extended in the second direction D2, and has an end overlapping with a portion of the floating diffusion FD. The crystallographic direction of the substrate 200 corresponding to the channel length direction of the first channel CH1 that provides the first area 220-1 of the first gate 220 and the crystallographic direction of the substrate 200 corresponding to the channel length direction of the second channel CH2 that provides the second area 220-2 of the first gate 220 may be the same.

The portion of the first gate 220 filling the recess pattern 218, which is a first channel CH1 providing the first area 220-1 of the first gate 220, may transfer the photocharges generated in the photoelectric conversion element PD to the floating diffusion FD in the vertical direction (FIG. 5A). Therefore, the channel length direction of the first channel CH1 may be the vertical direction. Since the crystallographic direction of the substrate 200 whose crystal faces of the surfaces FS and BS are the (100) plane is the <100> direction, which is the vertical direction, the crystallographic direction of the substrate 200 corresponding to the channel length direction of the first channel CH1 provided by the first area 220-1 of the first gate 220 is the <100> direction. Therefore, charges may be transferred quickly in the inside of the first channel CH1. The first gate 220 formed over the substrate 200, which is the second channel CH2 provided by the second area 220-2 of the first gate 220, may transfer the photocharges formed in the photoelectric conversion element PD to the floating diffusion FD in the horizontal direction. Therefore, the channel length direction of the second channel CH2 may be the horizontal direction. To be specific, the channel length direction of the second channel CH2 may be the second direction D2 which is the direction that the first active region 208 is extended. Since the crystallographic direction of the substrate 200 whose crystal faces of the surfaces FS and BS are the (100) plane is the <100> direction which corresponds to the second direction D2, the crystallographic direction of the substrate 200 corresponding to the channel length direction of the second channel CH2. Therefore, charges may be transferred quickly in the inside of the second channel CH2. In this way, the first transistor may be provided with improved characteristics. To be specific, when the first transistor transfers the photocharges generated in the photoelectric conversion element PD in response to the incident light to the floating diffusion FD, the first transistor may improve the transfer rate and the transfer efficiency. Herein, the crystallographic direction in which charges may transfer quickly may signify that the density of a lattice that may interrupt the transfer of charges is low. In other words, due to the low lattice density, the rate that the charges are lost by being trapped or rebounded while being transferred is low. In this way, the transfer efficiency may be improved.

The first gate 220 may include a first gate insulating layer 220B and a first gate electrode 220A that is formed over the first gate insulating layer 220B (FIGS. 5A and 5B). The first gate insulating layer 220B may further include a single layer selected from a group including an oxide, a nitride, and an oxynitride, or a multiple layer of two or more of them. The first gate electrode 220A may include a semiconductor material, e.g., polysilicon, or a metallic material, e.g., tungsten.

Also, the unit pixel 110 may include the second transistor including the second gate 230 formed over the second active region 210, and the third transistor including the third gate 240 (FIG. 3). Also, the unit pixel 110 may include a first impurity region 222 that is formed in the second active region 210 on a first side of the second gate 230, a second impurity region 224 that is formed in the second active region 210 on a second side of the second gate 230 or a first side of the third gate 240, and a third impurity region 226 that is formed in the second active region 210 on a second side of the third gate 240 (FIG. 3). The second impurity region 224 may be formed between the second gate 230 and the third gate 240.

The second gate 230 may be a reset gate. Therefore, the second transistor may be a reset transistor RX (FIG. 3). The first impurity region 222 and the second impurity region 224 may function as a source and a drain of the second transistor. Although not illustrated in the drawing, the first impurity region 222 may be coupled to the floating diffusion FD, and the second impurity region 224 may be coupled to the first node VDD that is set up with the power source voltage. The second gate 230 may be formed over the second region 210B in the second active region 210 (FIG. 5B). Therefore, the second gate 230 may be disposed at one corner among the corners of the unit pixel 110. For example, the second gate 230 may be disposed at the upper right corner of the unit pixel 110 (FIG. 3). In the second active region 210, the second region 210B has a bar shape that is extended in the second direction D2 (FIG. 4). Since the crystallographic direction of the substrate 200 corresponding to the channel length direction of the channel provided by the second gate 230 is the <100> direction, charges may transfer quickly and charge loss during the transfer may be prevented. In short, the second transistor may be provided with improved characteristics.

The third gate 240 may be a driver gate. Therefore, the third transistor may be a drive transistor DX (FIG. 3). The second impurity region 224 and the third impurity region 226 may function as a source and a drain of the third transistor. Although not illustrated in the drawing, the second impurity region 224 may be coupled to the first node VDD that is set up with the power source voltage, and the third impurity region 226 may be coupled to the column line, and the third gate 240 may be coupled to the floating diffusion FD. The third gate 240 may be formed over the first region 210A of the second active region 210 (FIG. 5A). Therefore, the third gate 240 may be disposed at one corner among the corners of the unit pixel 110. For example, the third gate 240 may be disposed at the upper left corner of the unit pixel 110 (FIG. 3). In the second active region 210, the first region 210A has a bar shape that is extended in the first direction D1 (FIG. 4). Since the crystallographic direction of the substrate 200 corresponding to the channel length direction of the channel provided by the third gate 240 is the <100> direction, charges may transfer quickly and charge loss during the transfer may be prevented. In short, the third transistor may be provided with improved characteristics.

The second gate 230 may include the second gate insulating layer 230E and the second gate electrode 230A formed over the second gate insulating layer 230B (FIG. 5B). The third gate 240 may include the third gate insulating layer 240B and the third gate electrode 240A formed over the third gate insulating layer 240B (FIG. 5A). The second gate insulating layer 2308 and the third gate insulating layer 240B may include a single layer selected from a group including an oxide, a nitride, and an oxynitride, and a multiple layer of at least two or more of them. The second gate electrode 230A and the third gate electrode 240A may include a semiconductor material, e.g., polysilicon, or a metallic material, e.g., tungsten.

Also, the unit pixel 110 may include a protective layer 260 formed over the back side BS of the substrate 200, a color separation element 262 formed over the protective layer 260, and a light focusing element 264 formed over the color separation element 262 (FIGS. 5A and 5B).

The protective layer 260 may have a negative fixed charge, and improve the dark current characteristics by using the negative fixed charge. The protective layer 260 may include a metal oxide that contains a metal element selected from a group including hafnium (Hf), zirconium (Zr), aluminum (Al), tantalum (Ta), titanium (Ti), Yttrium (Y), and lanthanoids. The color separation element 262 may include a color filter. The color filter may include one of a red filter, a green filter, a blue filter, a cyan filter, a yellow filter, a magenta filter, a white filter, a black filter, and an infrared ray (IR) cut-off filter. The light focusing element 264 may include a digital lens or a hemispherical lens.

The image sensor in accordance with the first embodiment of the present invention may include the recess pattern 218 formed at a position corresponding to the center of the photoelectric conversion element PD by including the first active region 208 and the second active region 210 that are extended in a diagonal direction. Herein, the active regions for the pixel transistors have a bar shape typically extended in the row direction RD or the column direction CD. Therefore, when the active regions are designed to have the recess pattern 218 disposed at the center of the photoelectric conversion element PD, a space for disposing other pixel transistors may not be provided. However, the image sensor in accordance with the first embodiment of the present invention may provide a space where other pixel transistors are to be formed while forming the recess pattern 218 at the position corresponding to the center of the photoelectric conversion element PD by providing the first active region 208 and the second active region 210 that are extended in the diagonal direction.

Also, in the image sensor in accordance with the first embodiment of the present invention, since the crystallographic direction of the substrate 200 corresponding to the channel length direction of the channel provided by the first gate 220 to the third gate 240 is the <100> direction, the operation characteristics of the pixel transistors including the first gate 220 to the third gate 240 may be improved. In particular, when the channel length direction of the channels of the pixel transistors is the row direction RD or the column direction CD in terms of the carrier mobility, the pixel transistors of the image sensor in accordance with the first embodiment of the present invention may perform a high-speed operation whose charge transfer rate is improved more than the case when the channel length direction of the channel is the row direction RD or the column direction CD, because the crystallographic direction of the substrate 200 corresponding thereto is the <110> direction.

Hereafter, an image sensor in accordance with a second embodiment of the present invention is described in detail with reference to FIGS. 6 to 9A and 9B. Herein, the image sensor in accordance with the second embodiment of the present invention is described by taking an example where one read-out circuit is coupled to one photoelectric conversion element PD and the read-out circuit is formed of four transistors.

Figure 6:
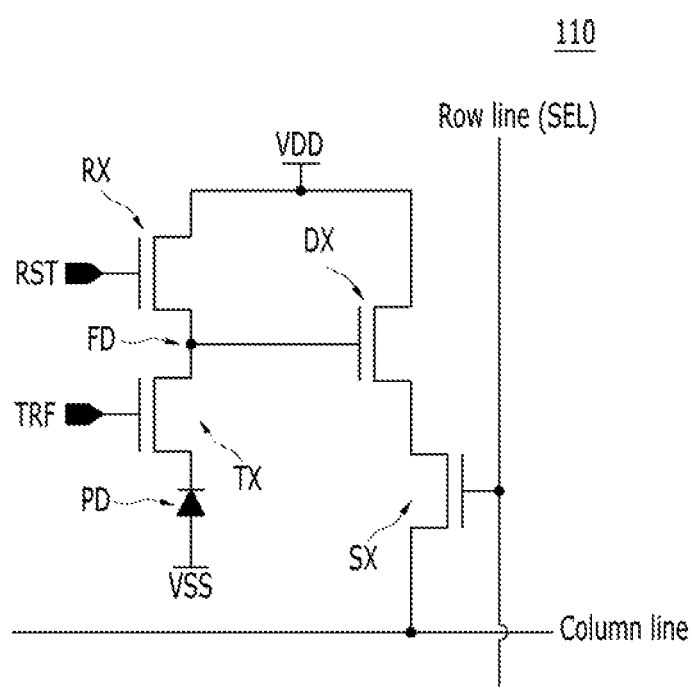
FIG. 6 is a diagram illustrating an equivalent circuit of a unit pixel of an image sensor in accordance with a second embodiment of the present invention.
Figure 7:
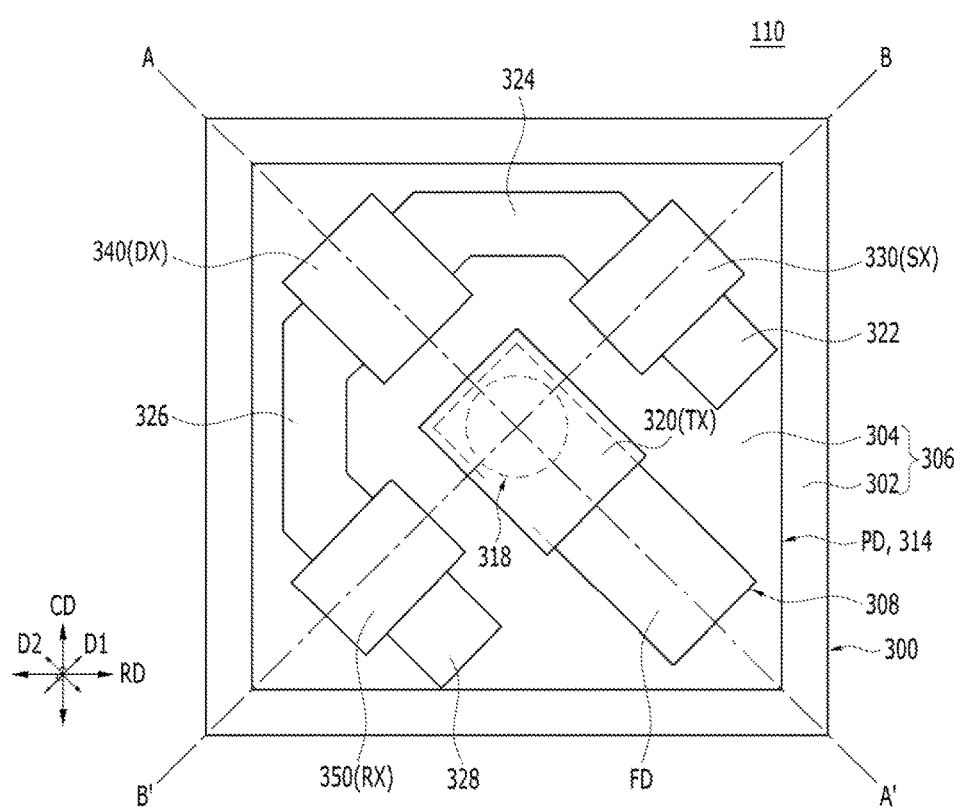
FIG. 7 is a plan view of the unit pixel of the image sensor in accordance with the second embodiment of the present invention.
Figure 8:
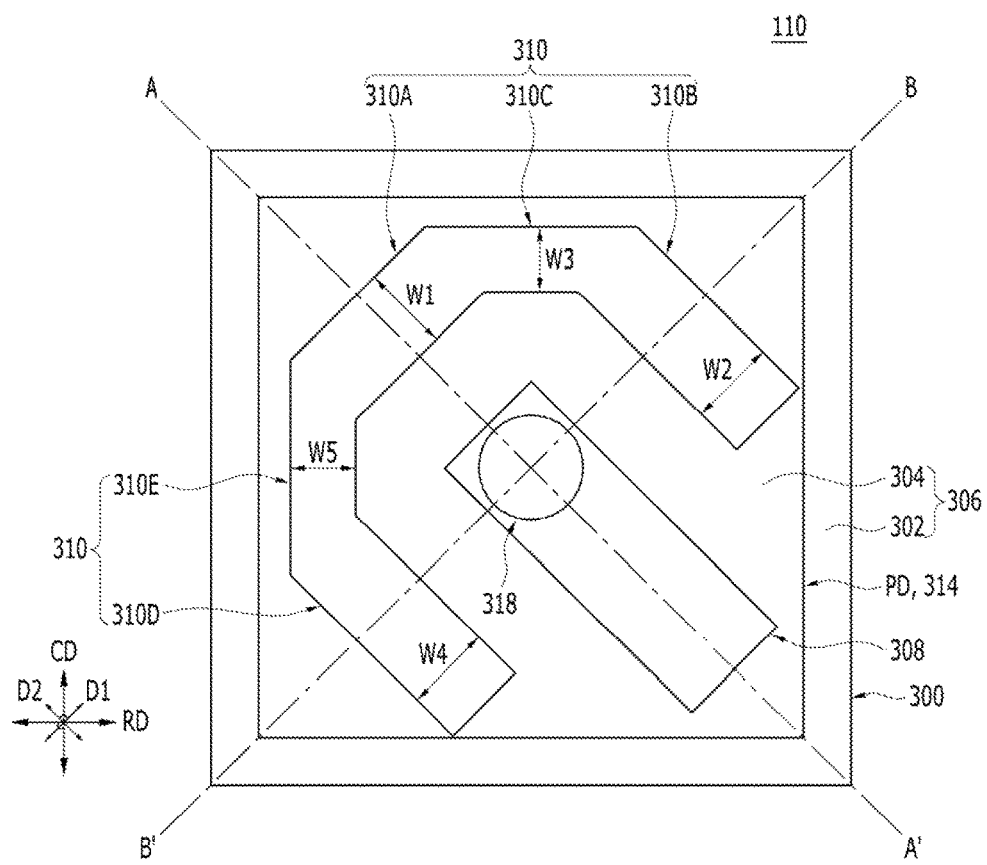
FIG. 8 is a plan view of a recess pattern and active regions in the unit pixel of the image sensor in accordance with the second embodiment of the present invention.
Figure 9A:
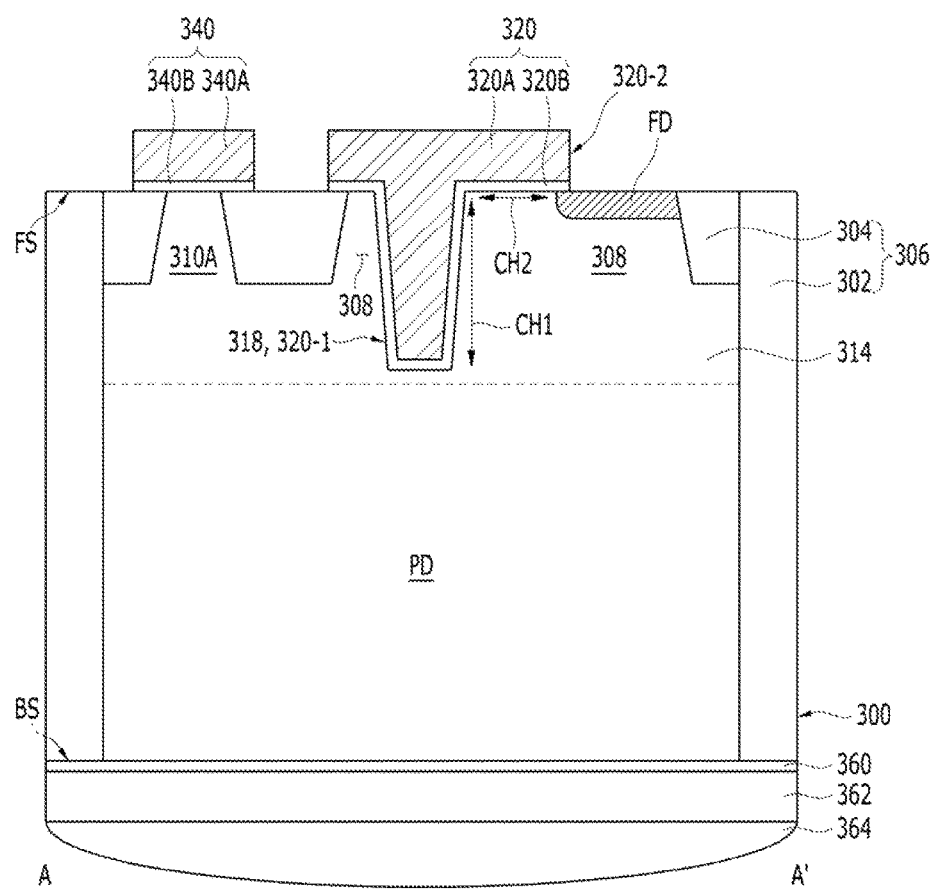
FIGS. 9A and 9B are cross-sectional views of the unit pixel of the image sensor in accordance with the second embodiment of the present invention that are taken along a line A-A' and a line B-B' shown in FIGS. 7 and 8, respectively.
Figure 9B:
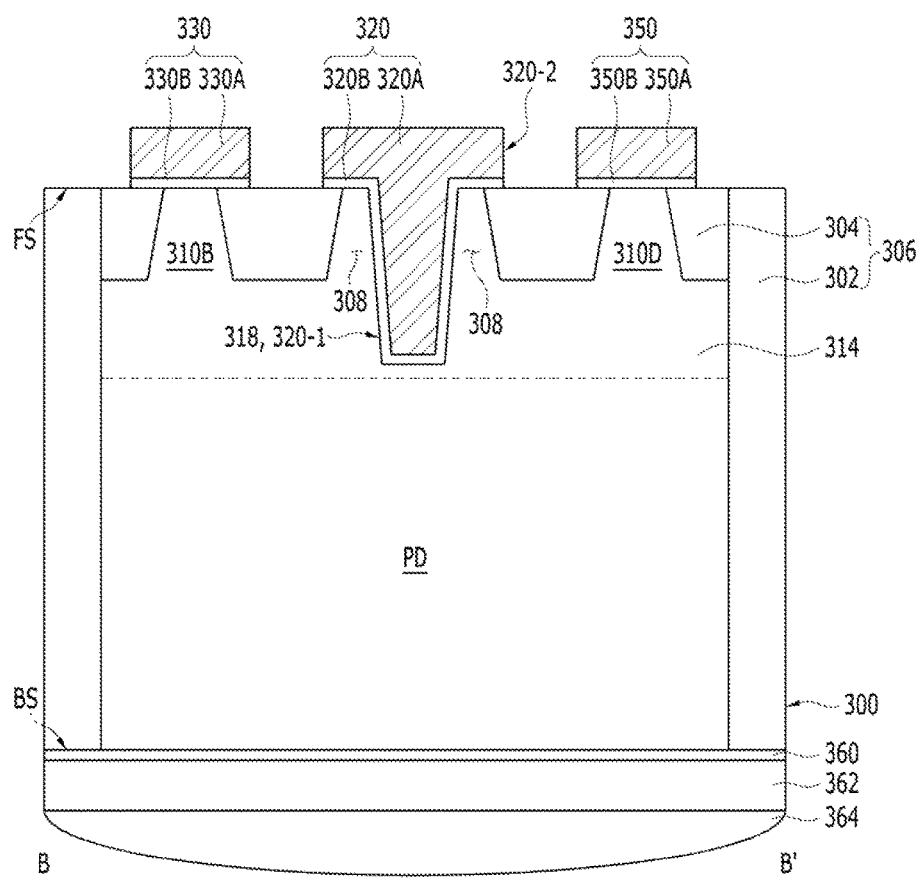

FIG. 6 is a diagram illustrating an equivalent circuit of a unit pixel of the image sensor in accordance with the second embodiment of the present invention. FIG. 7 is a plan view of the unit pixel of the image sensor in accordance with the second embodiment of the present invention. FIG. 8 is a plan view of a recess pattern and active regions in the unit pixel of the image sensor in accordance with the second embodiment of the present invention. FIGS. 9A and 9B are cross-sectional views of the unit pixel of the image sensor in accordance with the second embodiment of the present invention that are taken along a line A-A' and a line B-B' shown in FIGS. 7 and 8, respectively.

First of all, as illustrated in FIG. 6, the unit pixel 110 may include one read-out circuit and one photoelectric conversion element PD coupled to the read-out circuit. Herein, the read-out circuit may include a transfer transistor TX, a reset transistor RX, a drive transistor DX, and a selection transistor SX.

The photoelectric conversion element PD may be a photodiode. The photoelectric conversion element PD may be coupled between a transfer transistor TX and a second node VSS that is set up with a ground voltage. The reset transistor RX may be coupled between the transfer transistor TX and the first node VDD which is set up with a power source voltage. Also, a floating diffusion FD may be coupled between the reset transistor RX and the transfer transistor TX. The transfer transistor TX may operate in response to a transfer signal TRF that is applied through a transfer gate. The reset transistor RX may operate in response to a reset signal RST that is applied through a reset gate. A gate of the drive transistor DX may be coupled to the floating diffusion FD. One side (e.g., a drain) of the drive transistor DX may be coupled to the first node VDD, and another side (e.g., a source) of the drive transistor DX may be coupled to the selection transistor SX. The gate of the selection transistor SX, which is a selection gate, may be coupled to a row line that is extended from a row driver (refer to a reference numeral '150' of FIG. 1). One side (e.g., a drain) of the selection transistor SX may be coupled to the drive transistor DX, and another side (e.g., a source) of the selection transistor SX may be coupled to a column line. The selection transistor SX may output an image signal or an image reset signal that is generated in the drive transistor DX through the column line in response to a selection signal SEL that is applied to the selection gate through the row line. Herein, the image signal or an image reset signal may refer to an output voltage that is generated by processing a power source voltage to correspond to the amount of the photocharges stored in the floating diffusion FD.

Herein, the transfer transistor TX, the reset transistor RX and the drive transistor DX may be formed over a substrate 300 having a monocrystalline state as shown in FIG. 7. A channel of the transfer transistor TX, a channel of the reset transistor RX, and a channel of the drive transistor DX may have the same crystallographic direction of the substrate corresponding to the channel length direction. The surface of the substrate having a monocrystalline state may have a predetermined crystal face and crystallographic direction based on Miller Indices. For example, when the crystal face of the surface of the substrate is a (100) plane among a plurality of planes determined by Miller Indices, the channel of the transfer transistor TX, the channel of the reset transistor RX, and the channel of the drive transistor DX may have a crystallographic direction of the substrate corresponding to the channel length direction of a <100> direction among a plurality of directions determined by Miller Indices.

Subsequently, as illustrated in FIGS. 7, 8, and 9A and 9B, the unit pixel 110 may include a substrate 300, a recess pattern 318, a first gate 320, a second gate 330, a third gate 340, and a fourth gate 350. The substrate 300 may include a photoelectric conversion element PD which is isolated by an isolation structure 306. The recess pattern 318 may be formed in the substrate 300 to overlap with the photoelectric conversion element PD and correspond to the center of the photoelectric conversion element PD. The first gate 320 may fill the recess pattern 318 at least (FIGS. 9A and 9B). The second gate 330 may be formed over the substrate 300 to overlap with the photoelectric conversion element PD and formed on one side of the first gate 320 to be adjacent to the first gate 320 in a first direction D1 (FIG. 7). The third gate 340 may be formed over the substrate 300 to overlap with the photoelectric conversion element PD and to be adjacent to the first gate 320 in a second direction D2. The fourth gate 350 may be formed over the substrate 300 to overlap with the photoelectric conversion element PD and formed on another side of the first gate 320 to be adjacent to the first gate 320 in the first direction D1.

Hereafter the constituent elements are described in detail by referring to the accompanying drawings.

The unit pixel 110 may include the substrate 300 provided with a first active region 308 and a second active region 310 that are defined by an isolation structure 306 (FIGS. 7, 8, 9A and 9B). Also, the unit pixel 110 may include a photoelectric conversion element PD and a well 314 that are formed in the substrate 300. The photoelectric conversion element PD and the well 314 may overlap with each other and one sides of the photoelectric conversion element PD and the well 314 may contact each other so as to form a stacked structure in the up and down direction (FIGS. 9A and 9B).

The substrate 300 may be or include a semiconductor substrate of a monocrystalline state, and include a silicon-containing material. In other words, the semiconductor substrate may include a monocrystalline silicon-containing material. For example, the substrate 300 may be a monocrystalline bulk silicon substrate or a silicon epitaxial layer which is grown over a monocrystalline bulk silicon substrate.

In some embodiments, the surface of the substrate 300 having a monocrystalline state, which includes a front side FS and a back side BS, may have a predetermined crystal face and crystallographic direction that may be described based on Miller Indices (FIGS. 9A and 9B). For example, the crystal face of the surface FS and BS of the substrate 300 may be a (100) plane. Therefore, the vertical direction, which is a direction from the front side FS of the substrate 300 to the back side BS or a direction from the back side BS of the substrate 300 to the front side FS, may be a <100> direction. Also, the horizontal direction, which is the crystallographic direction corresponding to a row direction RD and a column direction CD which intersect with each other in the substrate 300, may be a <110> direction, and the crystallographic direction corresponding to the first direction D1 and the second direction D2 which intersect with each other in a diagonal direction may be the <100> direction. Herein, in the monocrystalline silicon substrate 300 having the (100) plane, the <100> direction is known having a higher carrier mobility than other crystallographic directions including the <110> direction. In particular, in terms of the migration of electrons, the <100> direction is known having a higher mobility than other crystallographic directions including the <110> direction.

The isolation structure 306 may include a Shallow Trench Isolation (STI), a Deep Trench Isolation (DTI), or a potential barrier. The potential barrier may include an impurity region that is formed by implanting an impurity into the substrate 300. For example, the potential barrier may be a P-type impurity region that is formed by implanting a P-type impurity, such as boron (B), into the substrate 300. The isolation structure 306 may include a first isolation structure 302 that isolates neighboring unit pixels 110 from each other and a second isolation structure 304 that defines the first active region 308, the second active region 310, and the pick-up region 312. The first isolation structure 302 may include the DTI or the potential barrier, and the second isolation structure 304 may include the STI. The first isolation structure 302 may be formed to be extended from the front side FS or the back side BS of the substrate 300 and penetrate through the substrate 300. The second isolation structure 304 may be formed in the well 314 to overlap with the photoelectric conversion element PD.

The photoelectric conversion element PD may include an organic or inorganic photodiode. For example, the photoelectric conversion element PD may have a stacked structure where a plurality of impurity regions formed in the substrate 300 and having complementary conductive types, e.g., P-type impurity regions and N-type impurity regions, are stacked in a vertical direction. The photoelectric conversion element PD may be formed to contact the back side BS of the substrate 300 (FIGS. 9A and 9B). The first isolation structure 302 may isolate neighboring photoelectric conversion elements PD.

The well 314 may provide a base for the pixel transistors to operate (FIGS. 9A and 9B). The well 314 may overlap with the photoelectric conversion element PD and the well 314 may be isolated from neighboring wells by the first isolation structure 302. The upper surface of the well 314 may contact the front side FS of the substrate 300, and the lower surface of the well 314 may contact the photoelectric conversion element PD. The well 314 may be formed by implanting impurity ions into the substrate 300. For example, the well 314 may be a P-type well 314 that is formed by implanting a P-type impurity into the substrate 300. All of the first active region 308, the second active region 310, and the pick-up region 312 may be formed in the well 314.

The first active region 308 may provide a space where at least a floating diffusion FD and a first transistor including the first gate 320 filling the recess pattern 318 are to be formed (FIGS. 7, 9A and 9B). The first active region 308 may have a bar shape that is extended in the second direction D2 and overlap with the photoelectric conversion element PD. The end of one side of the first active region 308 may overlap with the center of the photoelectric conversion element PD.

The second active region 310 may provide a space where a second transistor including the second gate 330 and a third transistor including the third gate 340, and a fourth transistor including the fourth gate 350 are to be formed (FIGS. 7 and 8). The second active region 310 may include a first region 310A having a bar shape extended in the first direction D1, a second region 310B having a bar shape extended in the second direction D2 and disposed in one side of the first gate 320 in the first direction D1, a third region 310C having a bar shape extended in the row direction RD and coupling the first region 310A and the second region 310B, a fourth region 310D having a bar shape extended in the second direction D2 and disposed in another side of the first gate 320 in the first direction D1, and a fifth region 310E having a bar shape extended in the column direction CD and coupling the first region 310A and the fourth region 310D. Each of the first region 310A, the second region 310B, and the fourth region 310D may be disposed at one corner among the corners of the unit pixel 110. For instance, the first region 310A may be disposed at an upper left corner of the unit pixel 110, and the second region 310B may be disposed at an upper right corner of the unit pixel 110. The fourth region 310D may be disposed at a lower left corner of the unit pixel 110. The line width W1, W2, W3, W4 and W5 of the first region 310A to the fifth region 310E may be all the same (i.e., W1=W2=W3=W4=W5) or the line width W1 of the first region 310A may be wider than the line widths W2, W3, W4 and W5 of the second region 310B to the fifth region 310E (i.e. W1>W2, W3, W4 and W5). The latter case may provide a greater channel area of the third gate 340 formed over the first region 310A than the channel areas of the gates formed over the other regions. When the third gate 340 functions as a driver gate, the third gate 340 may provide a driver gate having a relatively greater channel area, thus improving noise characteristics. The geometrical shape of the second active region 310 may be formed to have a <100> direction as a crystallographic direction of the substrate 300 corresponding to the channel length direction of the channels of the second transistor to the fourth transistor so as to improve the carrier mobility in the channel and provide a space where the pixel transistors are to be formed in the limited area.

Also, the unit pixel 110 may include the recess pattern 318 that is formed in the first active region 308 to overlap with the photoelectric conversion element PD and formed in the substrate 300 to correspond to the center of the photoelectric conversion element PD, the first transistor that includes the first gate 320 filling at least the recess pattern 318, and the floating diffusion FD that is formed in the first active region 308.

The recess pattern 318 may provide a channel for transferring the photocharges generated in the photoelectric conversion element PD in response to the incident light to the floating diffusion FD. The recess pattern 318 is required because the well 314 and the photoelectric conversion element PD for the pixel transistors are vertically stacked to improve the fill factor (FIGS, 9A and 9B). As the recess pattern 318 is disposed close to the center of the photoelectric conversion element PD, the transfer efficiency may be improved. Also, as the recess pattern 318 is disposed close to the center of the photoelectric conversion element PD, the distance to the isolation structure 306, particularly, the first isolation structure 302, is increased, thereby improving the dark current characteristics originating from the first isolation structure 302. The bottom surface of the recess pattern 318 may be close to the interface between the well 314 and the photoelectric conversion element PD. As a modified example, although not illustrated in the drawing, the recess pattern 318 may have a shape that the lower region of the recess pattern 318 is buried in the photoelectric conversion element PD. In other words, the bottom surface of the recess pattern 318 may be disposed at a lower level than the level of the interface between the well 314 and the photoelectric conversion element PD. Meanwhile, although not illustrated in the drawing, an impurity region for controlling a threshold voltage and the carrier mobility in the channel may be formed in the substrate 300 contacting the surface (which includes the sides and bottom surface) of the recess pattern 318.

The first gate 320 may be a transfer gate. Therefore, the first transistor may be a transfer transistor TX (FIG. 7). The photoelectric conversion element PD and the floating diffusion FD may function as a source and a drain of the first transistor, respectively. The first gate 320 may fill the recess pattern 318 and have a portion protruded toward the substrate 300, and the protruded end of the first gate 320 that is protruded over the substrate 300 may overlap with a portion of the floating diffusion FD (FIGS. 9A and 9B). To be specific, the first gate 320 may include a first area 320-1 filling the recess pattern 318, and a second area 320-2 that is formed over the first active region 308 to cover the first area 320-1, has a bar shape extended in the second direction D2, and has an end overlapping with a portion of the floating diffusion FD. The crystallographic direction of the substrate 300 corresponding to the channel length direction of the first channel CH1 that provides the first area 320-1 of the first gate 320 and the crystallographic direction of the substrate 300 corresponding to the channel length direction of the second channel CH2 that provides the second area 320-2 of the first gate 320 may be the same.

The portion of the first gate 320 filling the recess pattern 318, which is a first channel CH1 providing the first area 320-1 of the first gate 320, may transfer the photocharges generated in the photoelectric conversion element PD to the floating diffusion FD in the vertical direction (FIG. 9A). Therefore, the channel length direction of the first channel CH1 may be the vertical direction. Since the crystallographic direction of the substrate 300 whose crystal faces of the surfaces FS and BS are the (100) plane is the <100> direction, which is the vertical direction, the crystallographic direction of the substrate 300 corresponding to the channel length direction of the first channel CH1 provided by the first area 320-1 of the first gate 320 is the <100> direction. Therefore, charges may be transferred quickly in the inside of the first channel CH1. The first gate 320 formed over the substrate 300, which is the second channel CH2 provided by the second area 320-2 of the first gate 320, may transfer the photocharges formed in the photoelectric conversion element PD to the floating diffusion FD in the horizontal direction. Therefore, the channel length direction of the second channel CH2 may be the horizontal direction. To be specific, the channel length direction of the second channel CH2 may be the second direction D2 which is the direction that the first active region 308 is extended. Since the crystallographic direction of the substrate 300 whose crystal faces of the surfaces FS and BS are the (100) plane is the <100> direction which corresponds to the second direction D2, the crystallographic direction of the substrate 300 corresponding to the channel length direction of the second channel CH2. Therefore, charges may be transferred quickly in the inside of the second channel CH2. In this way, the first transistor may be provided with improved characteristics. To be specific, when the first transistor transfers the photocharges generated in the photoelectric conversion element PD in response to the incident light to the floating diffusion FD, the first transistor may improve the transfer rate and the transfer efficiency. Herein, the crystallographic direction in which charges may transfer quickly may signify that the density of a lattice that may interrupt the transfer of charges is low. In other words, due to the low lattice density, the rate that the charges are lost by being trapped or rebounded while being transferred is low. In this way, the transfer efficiency may be improved.

The first gate 320 may include a first gate insulating layer 320E and a first gate electrode 320A that is formed over the first gate insulating layer 320B (FIGS. 9A and 9B). The first gate insulating layer 320B may further include a single layer selected from a group including an oxide, a nitride, and an oxynitride, or a multiple layer of two or more of them. The first gate electrode 320A may include a semiconductor material, e.g., polysilicon, or a metallic material, e.g., tungsten.

Also, the unit pixel 110 may include the second transistor including the second gate 330 formed over the second active region 310, and the third transistor including the third gate 340, and a fourth transistor including the fourth gate 350 (FIG. 7). Also, the unit pixel 110 may include a first impurity region 322 that is formed in the second active region 310 on a first side of the second gate 330, a second impurity region 324 that is formed in the second active region 310 between the second gate 330 and the third gate 340, a third impurity region 326 that is formed in the second active region 310 between the third gate 340 and the fourth gate 350, and a fourth impurity region 328 that is formed in the second active region 310 on a first side of the fourth gate 350 (FIG. 7).

The second gate 330 may be a selection gate. Therefore, the second transistor may be a selection transistor SX (FIG. 7). The first impurity region 322 and the second impurity region 324 may function as a source and a drain of the second transistor. Although not illustrated in the drawing, the first impurity region 322 may be coupled to the column line. The second gate 330 may be formed over the second region 310B in the second active region 310 (FIG. 9B). Therefore, the second gate 330 may be disposed at one corner among the corners of the unit pixel 110. For example, the second gate 330 may be disposed at the upper right corner of the unit pixel 110 (FIG. 7). In the second active region 310, the second region 310B has a bar shape that is extended in the second direction D2 (FIG. 8). Since the crystallographic direction of the substrate 300 corresponding to the channel length direction of the channel provided by the second gate 330 is the <100> direction, charges may transfer quickly and charge loss during the transfer may be prevented. short, the second transistor may be provided with improved characteristics.

The third gate 340 may be a driver gate. Therefore, the third transistor may be a drive transistor DX (FIG. 7). The second impurity region 324 and the third impurity region 326 may function as a source and a drain of the third transistor. Although not illustrated in the drawing, the third impurity region 326 may be coupled to the first node VDD that is set up with the power source voltage, and the third gate 340 may be coupled to the floating diffusion FD. The third gate 340 may be formed over the first region 310A of the second active region 310 (FIG. 9A). Therefore, the third gate 340 may be disposed at one corner among the corners of the unit pixel 110. For example, the third gate 340 may be disposed at the upper left corner of the unit pixel 110 (FIG. 7). In the second active region 310, the first region 310A has a bar shape that is extended in the first direction D1 (FIG. 8). Since the crystallographic direction of the substrate 300 corresponding to the channel length direction of the channel provided by the third gate 340 is the <100> direction, charges may transfer quickly and charge loss during the transfer may be prevented. In short, the third transistor may be provided with improved characteristics.

The fourth gate 350 may be a reset gate. Therefore, the fourth transistor may be a reset transistor RX (FIG. 7). The third impurity region 326 and the fourth impurity region 328 may function as a source and a drain of the third transistor. Although not illustrated in the drawing, the third impurity region 326 may be coupled to the first node VDD that is set up with the power source voltage, and the fourth impurity region 328 may be coupled to the floating diffusion FD. The fourth gate 350 may be formed over the fourth region 310D in the second active region 310 (FIG. 9B). Therefore, the fourth gate 350 may be disposed at one corner among the corners of the unit pixel 110. For example, the fourth gate 350 may be disposed at the lower left corner of the unit pixel 110 (FIG. 7). In the second active region 310, the fourth region 310D has a bar shape that is extended in the second direction D2 (FIG. 8). Since the crystallographic direction of the substrate 200 corresponding to the channel length direction of the channel provided by the fourth gate 350 is the <100> direction, charges may transfer quickly and charge loss during the transfer may be prevented. In short, the fourth transistor may be provided with improved characteristics.

The second gate 330 may include the second gate insulating layer 330B and the second gate electrode 330A formed over the second gate insulating layer 330B (FIG. 9B). The third gate 340 may include the third gate insulating layer 340B and the third gate electrode 340A formed over the third gate insulating layer 340B (FIG. 9A). The fourth gate 350 may include the fourth gate insulating layer 350B and the fourth gate electrode 350A formed over the fourth gate insulating layer 350B (FIG. 9B). The second gate insulating layer 330B to the fourth gate insulating layer 350B may include a single layer selected from a group including an oxide, a nitride, and an oxynitride, and a multiple layer of at least two or more of them. The second gate electrode 330A to the fourth gate electrode 350A may include a semiconductor material, e.g., polysilicon, or a metallic material, e.g., tungsten.

Also, the unit pixel 110 may include a protective layer 360 formed over the back side BS of the substrate 300, a color separation element 362 formed over the protective layer 360, and a light focusing element 364 formed over the color separation element 362 (FIGS. 9A and 9B).

The protective layer 360 may have a negative fixed charge, and improve the dark current characteristics by using the negative fixed charge. The protective layer 360 may include a metal oxide that contains a metal element selected from a group including hafnium (Hf), zirconium (Zr), aluminum (Al), tantalum (Ta), titanium (Ti), Yttrium (Y), and lanthanoids. The color separation element 362 may include a color filter. The color filter may include one of a red filter, a green filter, a blue filter, a cyan filter, a yellow filter, a magenta filter, a white filter, a black filter, and an infrared ray (IR) cut-off filter. The light focusing element 364 may include a digital lens or a hemispherical lens.

The image sensor in accordance with the second embodiment of the present invention may include the recess pattern 318 formed at a position corresponding to the center of the photoelectric conversion element PD by including the first active region 308 and the second active region 310 that are extended in a diagonal direction.

Also, in the image sensor in accordance with the second embodiment of the present invention, since the crystallographic direction of the substrate 300 corresponding to the channel length direction of the channel provided by the first gate 320 to the fourth gate 350 is the <100> direction, the operation characteristics of the pixel transistors including the first gate 320 to the fourth gate 350 may be improved.

Hereafter, a case where a plurality of the unit pixels 110 share one read-out circuit is described in detail by referring to the accompanying drawings. Herein, a read-out circuit having a 4T structure is taken as an example, and for the sake of convenience in description, the unit pixels 110 of the image sensor in accordance with the first embodiment of the present invention are used.

Figure 10:
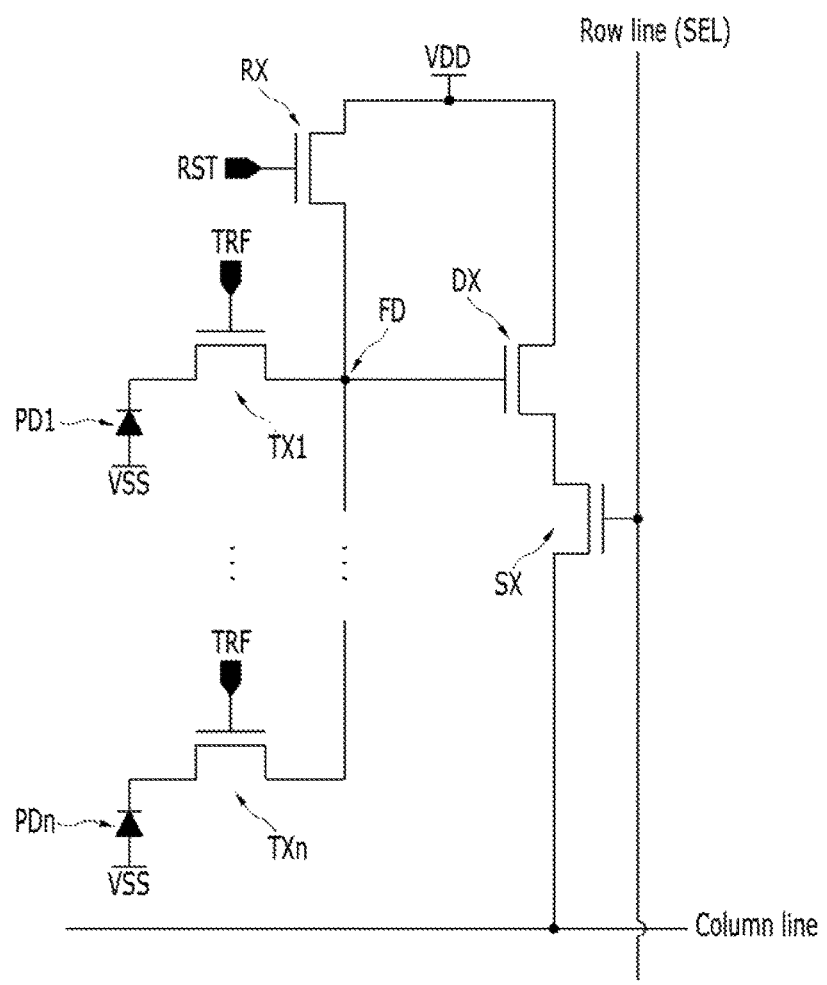
FIG. 10 is a diagram illustrating an equivalent circuit of a sub-array of an image sensor in accordance with third and fourth embodiments of the present invention.
Figure 11:
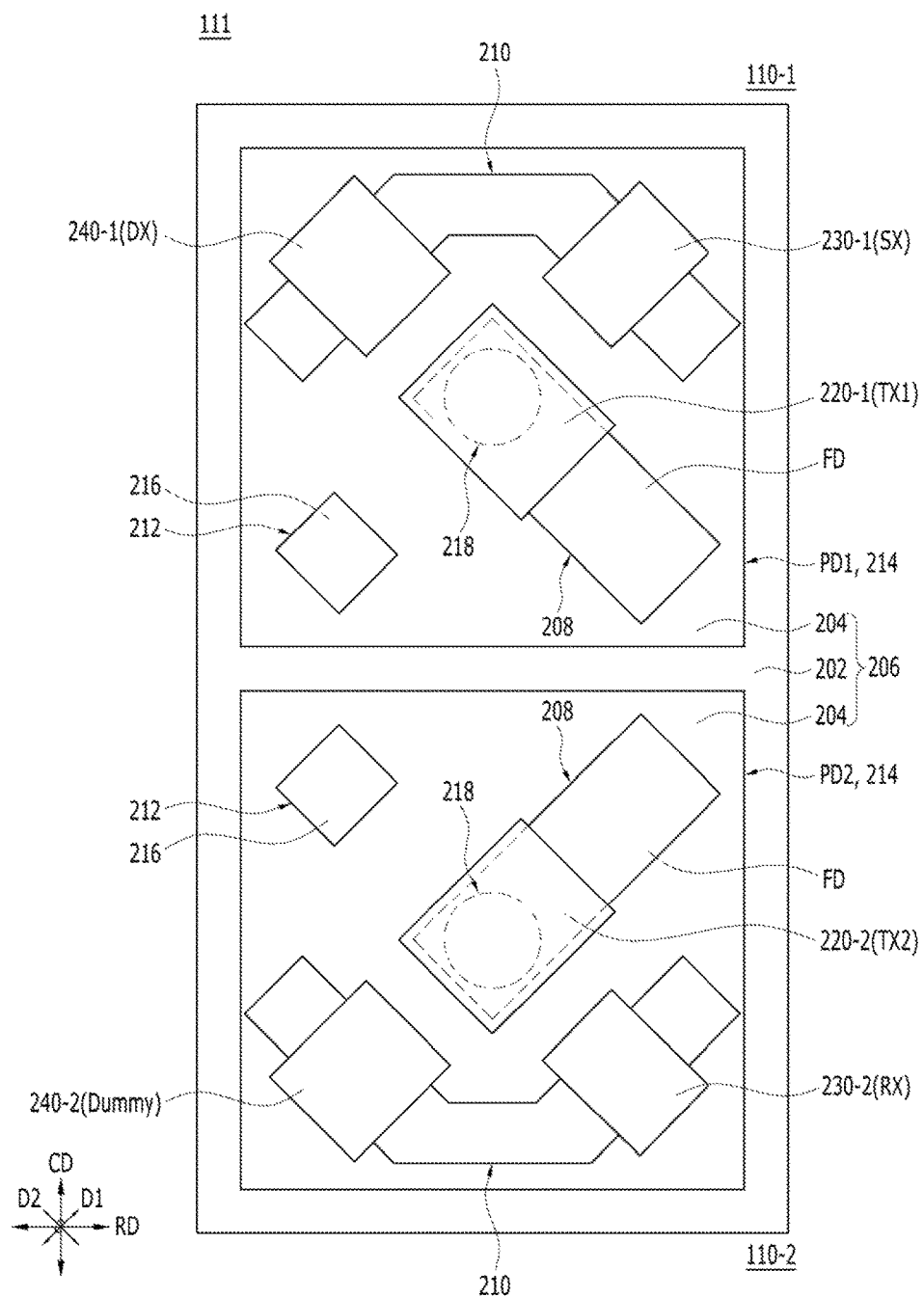
FIG. 11 is a plan view of the sub-array of the image sensor in accordance with the third embodiment of the present invention.
Figure 12:
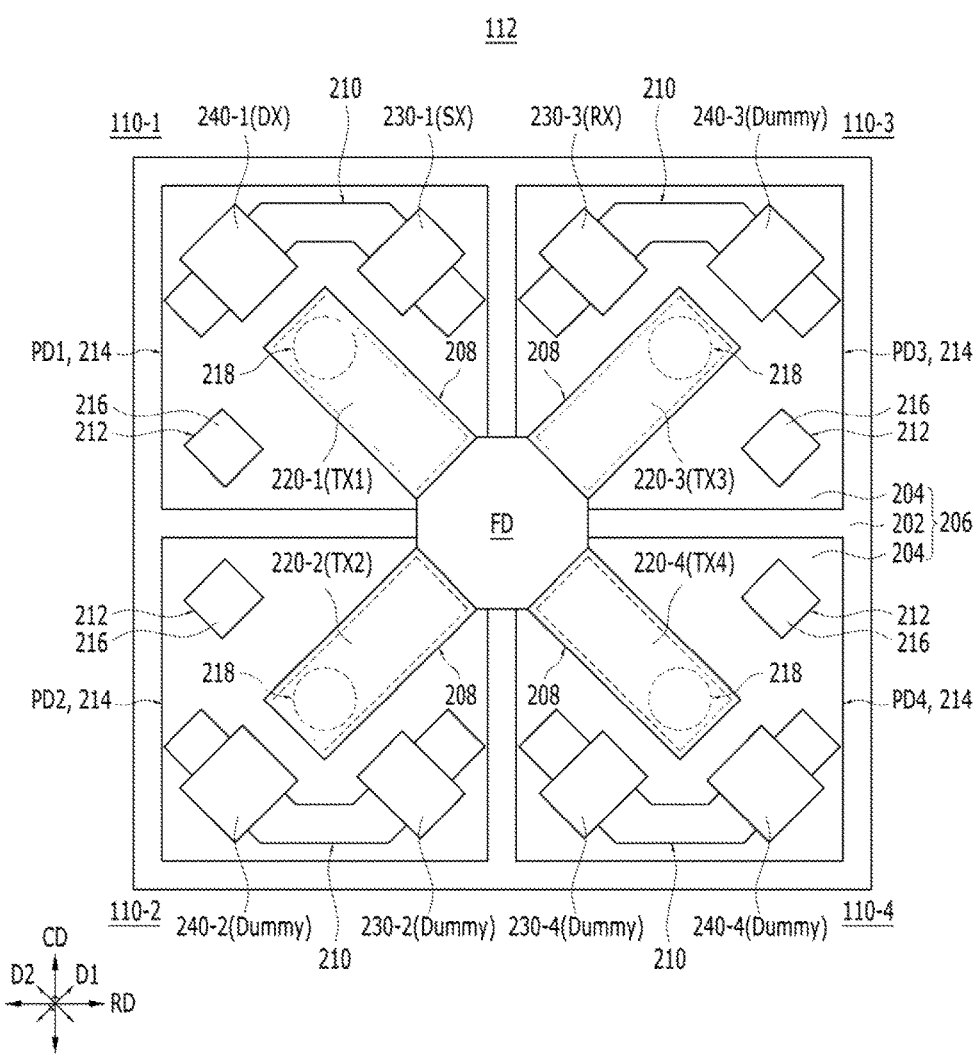
FIG. 12 is a plan view of the sub-array of the image sensor in accordance with the fourth embodiment of the present invention.

FIG. 10 is a diagram illustrating an equivalent circuit of a sub-array of an image sensor in accordance with third and fourth embodiments of the present invention. FIG. 11 is a plan view of the sub-array of the image sensor in accordance with the third embodiment of the present invention. FIG. 12 is a plan view of the sub-array of the image sensor in accordance with the fourth embodiment of the present invention.

First of all, as illustrated in FIGS. 10 and 11, the pixel array (refer to a reference numeral '100' of FIG. 1) of the image sensor in accordance with the third embodiment of the present invention may include a plurality of sub-arrays 111. Each of the sub-arrays 111 may include a plurality of unit pixels 110-1 and 110-2 that are arrayed in an N×M matrix form, where each of N and M is a natural number. In each of the sub-arrays 111, the unit pixels 110-1 and 110-2 may form a planar shape that is symmetrical in a row direction RD or a column direction CD.

To be specific, each of the sub-arrays 111 may include a first unit pixel 110-1 and a second unit pixel 110-2 that are arrayed in a 1×2 matrix form. The first unit pixel 110-1 and the second unit pixel 110-2 may have a planar shape that is symmetrical in the column direction CD. The first unit pixel 110-1 and the second unit pixel 110-2 may have the same structure as that of the unit pixel 110 in accordance with the first embodiment of the present invention, which is described above.

A first gate 220-1 of the first u t pixel 110-1 and a first gate 220-2 of the second unit pixel 110-2 may function as transfer gates of a first photoelectric conversion element PD1 and a second photoelectric conversion element PD2, respectively. A second gate 230-1 and a third gate 240-1 of the first unit pixel 110-1 may function as a selection gate and a drive gate, respectively. A second gate 230-2 of the second unit pixel 110-2 may function as a reset gate. A third gate 240-2 of the second unit pixel 110-2 may be a dummy gate. In other words, the third gate 240-2 of the second unit pixel 110-2 is formed to provide a symmetrical structure in the inside of each sub-array 111 for the purpose of stabilization in the production yield and it does not function as a read-out circuit.

Referring to FIGS. 10 and 12, the pixel array (refer to a reference numeral '100' of FIG. 1) of the image sensor in accordance with the fourth embodiment of the present invention may include a plurality of sub-arrays 112. Each of the sub-arrays 112 may include a plurality of unit pixels 110-1 to 110-4 that are arrayed in an N×M matrix form, where each of N and M is a natural number. In each of the sub-arrays 112, the unit pixels 110-1 to 110-4 may have a planar shape that is symmetrical in a row direction RD and a column direction CD.

To be specific, each of the sub-arrays 112 may include a first unit pixel 110-1 to a fourth unit pixel 110-4 that are arrayed in a 2×2 matrix form. In each of the sub-arrays 112, one floating diffusion FD may be disposed at the center of the sub-array 112 and the plurality of unit pixels 110-1 to 110-4 may share the floating diffusion FD. In the lower portion of the floating diffusion FD, a well 214 may be formed and there may not be a first isolation structure 220. The first unit pixel 110-1 and the third unit pixel 110-3 may have a planar shape that is symmetrical to the second unit pixel 110-2 and the fourth unit pixel 110-4 in the column direction CD, respectively. Also, the first unit pixel 110-1 and the second unit pixel 110-2 may have a planar shape that is symmetrical to the third unit pixel 110-3 and the fourth unit pixel 110-4 in the row direction RD, respectively. The first unit pixel 110-1 to the fourth unit pixel 110-4 may have the same structure as that of the unit pixel 110 in accordance with the first embodiment of the present invention, which is described above.

A first gate 220-1 of the first unit pixel 110-1 to a first gate 220-4 of the fourth unit pixel 110-4 may function as transfer gates of a first photoelectric conversion element PD1 to a fourth photoelectric conversion element PD4, respectively. A second gate 230-1 and a third gate 240-1 of the first unit pixel 110-1 may function as a selection gate and a drive gate, respectively. A second gate 230-3 of the third unit pixel 110-3 may function as a reset gate. A third gate 240-3 of the third unit pixel 110-3, the second gate 230-2 and the third gate 240-2 of the second unit pixel 110-2, and the second gate 230-4 and the third gate 240-4 of the fourth unit pixel 110-4 may be dummy gates. The dummy gates are formed to provide a symmetrical structure in the inside of each sub-array 112 for the purpose of stabilization in the production yield, and they do not function as a read-out circuit.

Meanwhile, in the third and fourth embodiments of the present invention, which are described above, a case where the unit pixels 110 in accordance with the first embodiment of the present invention is exemplarily described. However, it is obvious to those skilled in the art that the unit pixels 110 in accordance with the second embodiment of the present invention may be used for the third and fourth embodiments of the present invention.

The image sensor in accordance with an embodiment of the present invention may be used in various electronic devices or systems. Hereafter, a camera including an image sensor in accordance with an embodiment of the present invention ill be described with reference to FIG. 13.

Figure 13:
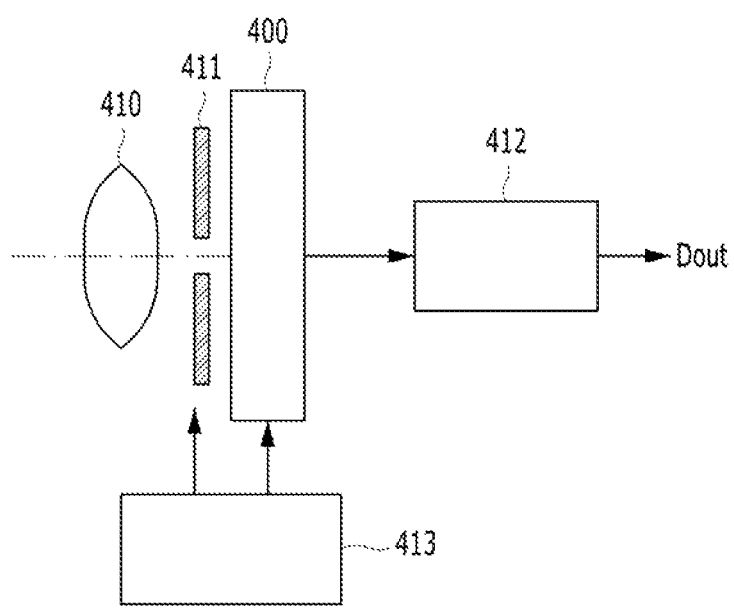
FIG. 13 is a diagram schematically illustrating an electronic device including an image sensor in accordance with an embodiment of the present invention.

FIG. 13 is a diagram schematically illustrating an electronic device including an image sensor 400 in accordance with an embodiment of the present invention. Referring to FIG. 13, the electronic device including the image sensor 400 may be a camera capable of taking a still image or a moving image. The electronic device may include the image sensor 400, an optical system or optical lens 410, a shutter unit 411, a driving unit 413 for controlling/driving the image sensor 400 and the shutter unit 411, and a signal processing unit 412.

The optical system 410 may guide image light from an object to the pixel array 100 of the image sensor 400. The optical system 410 may include a plurality of optical lenses. The shutter unit 411 may control a light irradiation period and a light shield period for the image sensor 400. The driving unit 413 may control a transmission operation of the image sensor 400 and shutter operation of the shutter unit 411. The signal processing unit 412 may process signals received from the image sensor 400 in various manners. The processed image signals Iout may be stored in a storage medium such as a memory or outputted to a monitor or the like.

According to the embodiments of the present invention, transfer efficiency and dark current characteristics of an image sensor may be improved by forming a recess pattern for coupling a photoelectric conversion element and a floating diffusion at the center of the photoelectric conversion element in an image sensor having a stacked structure where the photoelectric conversion element and pixel transistors are stacked.

Also, by including active regions that are extended in a diagonal direction, the recess pattern is formed to be disposed at the center of the photoelectric conversion element while providing a space for the pixel transistors.

Also, operation characteristics of the pixel transistors may be improved by making a crystallographic direction of a substrate corresponding to a channel-length direction of a channel of a pixel transistor in a <100> direction.

While the present invention has been described with respect to the specific embodiments, it will be apparent to those skilled in the art that various changes and modifications may be made without departing from the spirit and scope of the invention as defined in the following claims.

What is claimed is:

1. An image sensor, comprising:
   a pixel array including a plurality of unit pixels that are arrayed in two dimensions,
   wherein each of the plurality of the unit pixels includes:
      a substrate including a photoelectric conversion element;
      a recess pattern formed in the substrate to overlap with the photoelectric conversion element and correspond to a center of the photoelectric conversion element;
      a first gate suitable for filling at least the recess pattern;
      a second gate formed over the substrate to overlap with the photoelectric conversion element and to be adjacent to the first gate in a first diagonal direction; and
      a third gate formed over the substrate to overlap with the photoelectric conversion element and to be adjacent to the first gate in a second diagonal direction which intersects with the first diagonal direction.

2. The image sensor of claim 1, wherein each of the plurality of the unit pixels further includes:
   a floating diffusion that is formed to confront the third gate based on the first gate in the second diagonal direction; and
   a first active region that overlaps with the photoelectric conversion element and has a first end where the recess pattern is disposed and a second end where the floating diffusion is disposed.

3. The image sensor of claim 2, wherein the first gate includes:
   a first region for filling the recess pattern; and
   a second region that is formed over the first active region to cover the first region and has an end overlapping with a portion of the floating diffusion.

4. The image sensor of claim 3, wherein the substrate has a monocrystalline state, and
   a crystallographic direction of the substrate corresponding to a channel length direction of a channel provided by the first region of the first gate is the same as a crystallographic direction of the substrate corresponding to a channel length direction of a channel provided by the second region of the first gate.

5. The image sensor of claim 3, wherein a crystal face of a surface of the substrate is a (100) plane among a plurality of planes determined by Miller Indices, and
   a crystallographic direction of the substrate corresponding to a channel length direction of a channel provided by the first region of the first gate and a channel length direction of a channel provided by the second region of the first gate is a <100> direction among a plurality of directions determined by Miller Indices.

6. The image sensor of claim 1, wherein each of the plurality of the unit pixels further includes:
   a second active region that is disposed adjacent to the first active region while overlapping with the photoelectric conversion element, and
   the second active region includes:
      a first region that has a bar shape extended in the first diagonal direction;
      a second region that has a bar shape extended in the second diagonal direction; and
      a third region that couples the first region and the second region to each other.

7. The image sensor of claim 6, wherein the third gate is disposed over the first region of the second active region, and the second gate is disposed over the second region of the second active region.

8. The image sensor of claim 1, wherein a crystal'face of a surface of the substrate is a (100) plane among a plurality of planes determined by Miller Indices, and
   a crystallographic direction of the substrate corresponding to a channel length direction of a channel provided by the first gate, a channel length direction of a channel provided by the second gate, and a channel length direction of a channel provided by the third gate is a <100> direction among a plurality of directions determined by Miller Indices.

9. The image sensor of claim 1, wherein each of the plurality of the unit pixels further includes:
   a well that is formed in the substrate to overlap with the photoelectric conversion element; and
   a pick-up region that is formed to overlap with the photoelectric conversion element and confront the second gate based on the first gate in the first diagonal direction.

10. The image sensor of claim 1, wherein the pixel array includes a plurality of sub-arrays each of which include a read-out circuit, and
    each of the plurality of the sub-arrays includes a plurality of unit pixels that are arrayed in an N×M matrix form (where each of N and M is a natural number), and
    the plurality of the unit pixels have a planar shape that is symmetrical in a row direction and/or column direction in each of the plurality of the sub-arrays.

11. The image sensor of claim 10, wherein the read-out circuit includes a transfer transistor including a transfer gate, a reset transistor including a reset gate, a drive transistor including a drive gate, and a selection transistor including a selection gate, and
    when each of the plurality of the sub-arrays includes a first unit pixel and a second unit pixel that are arrayed in a 1×2 matrix structure,
    a first gate of the first unit pixel and a first gate of the second unit pixel correspond to the transfer gate, and
    a second gate of the first unit pixel, a third gate of the first unit pixel, and a second gate of the second unit pixel correspond to the selection gate, the drive gate, and the reset gate, respectively, and
    a third gate of the second unit pixel is a dummy gate.

12. The image sensor of claim 10, wherein the read-out circuit includes a transfer transistor including a transfer gate, a reset transistor including a reset gate, a drive transistor including a drive gate, and a selection transistor including a selection gate, and
    when each of the plurality of the sub-arrays includes a first unit pixel, a second unit pixel, a third unit pixel, and a fourth unit pixel that are arrayed in a 2×2 matrix structure,
    first gates of the first unit pixel to the fourth unit pixel correspond to the transfer gate, and a second gate of the first unit pixel, a third gate of the first unit pixel, and a second gate of the second unit pixel correspond to the selection gate the drive gate, and the reset gate, respectively, and
    a third gate of the second unit pixel, first to third gates of the third unit pixel, and first to third gates of the fourth unit pixel are dummy gates.

13. An image sensor, comprising:
    a pixel array including a plurality of unit pixels that are arrayed in two dimensions, wherein each of the plurality of the unit pixels includes:
a substrate including a photoelectric conversion element;
a recess pattern formed in the substrate to overlap with the photoelectric conversion element and correspond to a center of the photoelectric conversion element;
a first gate suitable for filling at least the recess pattern;
a second gate formed over the substrate to overlap with the photoelectric conversion element and formed on a first side of the first gate to be adjacent to the first gate in a first diagonal direction that intersects with a second diagonal direction;
a third gate formed over the substrate to overlap with the photoelectric conversion element and to be adjacent to the first gate in the second diagonal direction; and
a fourth gate formed over the substrate to overlap with the photoelectric conversion element: and formed on a second side of the first gate to be adjacent to the first gate in the first diagonal direction.

14. The image sensor of claim 13, wherein each of the plurality of the unit pixels further includes:
a floating diffusion that is formed to confront the third gate based on the first gate in the second diagonal direction; and
a first active region that overlaps with the photoelectric conversion element and has a first end where the recess pattern is disposed and a second end where the floating diffusion is disposed.

15. The image sensor of claim 14, wherein the first gate includes:
a first region for filling the recess pattern; and
a second region that is formed over the first active region to cover the first region and has an end overlapping with a portion of the floating diffusion.

16. The image sensor of claim 13, wherein'each of the plurality of the unit pixels further includes:
a second active region that overlaps with the photoelectric conversion element and is disposed adjacent to the first active region, and
the second active region includes:
a first region that has a bar shape extended in the first diagonal direction;
a second region that has a bar shape extended in the second diagonal direction and is disposed on the first side of the first gate in the first diagonal direction;
a third region suitable for coupling the first region and the second region to each other;
a fourth region that has a bar shape extended in the second diagonal direction and is disposed on the second side of the first gate in the first diagonal direction; and
a fifth region suitable for coupling the first region and the fourth region to each other.

17. The image sensor of claim 16, wherein the third gate is disposed on a first region of the second active region, and the second gate is disposed on a second region of the second active region, and the fourth gate is disposed on a fourth region of the second active region.

18. The image sensor of claim 3, wherein the substrate has a monocrystalline state,
a crystal face of a surface of the substrate is a (100) plane among a plurality of planes determined by Miller Indices, and
a crystallographic direction of the substrate corresponding to a channel length direction of a channel provided by the first gate, a channel length direction of a channel provided by the second gate, a channel length direction of a channel provided by the third gate, and a channel length direction of a channel provided by the fourth gate is a <100> direction among a plurality of directions determined by Miller Indices.

19. The image sensor of claim 13, wherein the pixel array includes a plurality of sub-arrays, and
each of the plurality of the sub-arrays includes a plurality of unit pixels that are arrayed in an N×M matrix form (where each of N and M is a natural number), and
the plurality of the unit pixels have a planar shape that is symmetrical in a row direction and/or column direction in each of the plurality of the sub-arrays.

* * * * *